United States Patent
Yang

(10) Patent No.: US 8,999,838 B2
(45) Date of Patent: Apr. 7, 2015

(54) SEMICONDUCTOR DEVICES AND METHODS OF MANUFACTURING THE SAME

(75) Inventor: Chin-Cheng Yang, Gangshan Twon (TW)

(73) Assignee: Macronix International Co., Ltd., Hsin-chu (TW)

(*) Notice: Subject to any disclaimer, the term of this patent is extended or adjusted under 35 U.S.C. 154(b) by 185 days.

(21) Appl. No.: 13/223,138

(22) Filed: Aug. 31, 2011

(65) Prior Publication Data

US 2013/0048984 A1    Feb. 28, 2013

(51) Int. Cl.
*H01L 23/48* (2006.01)
*H01L 21/311* (2006.01)
*H01L 21/033* (2006.01)
*H01L 21/3213* (2006.01)
*H01L 21/768* (2006.01)

(52) U.S. Cl.
CPC ...... *H01L 21/31144* (2013.01); *H01L 21/0337* (2013.01); *H01L 21/32139* (2013.01); *H01L 21/76805* (2013.01); *H01L 21/76816* (2013.01)

(58) Field of Classification Search
USPC .......... 438/714, 706, 725, 675, 733; 257/758, 257/314, 211
See application file for complete search history.

(56) References Cited

U.S. PATENT DOCUMENTS

| | | | | |
|---|---|---|---|---|
| 5,677,239 | A * | 10/1997 | Isobe | 438/633 |
| 6,063,711 | A * | 5/2000 | Chao et al. | 438/724 |
| 6,323,118 | B1 * | 11/2001 | Shih et al. | 438/624 |
| 6,617,257 | B2 * | 9/2003 | Ni et al. | 438/725 |
| 6,737,352 | B2 * | 5/2004 | Liu et al. | 438/637 |
| 6,784,552 | B2 * | 8/2004 | Nulty et al. | 257/774 |
| 6,841,465 | B2 * | 1/2005 | Choi | 438/622 |
| 7,365,009 | B2 * | 4/2008 | Chou et al. | 438/675 |
| 7,563,723 | B2 * | 7/2009 | Abatchev et al. | 438/714 |
| 7,855,457 | B2 * | 12/2010 | Mizukami et al. | 257/758 |
| 7,982,285 | B2 * | 7/2011 | Park et al. | 257/530 |
| 8,188,517 | B2 * | 5/2012 | Choi | 257/211 |
| 2002/0173157 | A1 * | 11/2002 | Chang et al. | 438/700 |
| 2009/0020744 | A1 * | 1/2009 | Mizukami et al. | 257/4 |
| 2012/0044748 | A1 * | 2/2012 | Chung | 365/148 |

* cited by examiner

*Primary Examiner* — Bradley K Smith
*Assistant Examiner* — David Goodwin
(74) *Attorney, Agent, or Firm* — Alston & Bird LLP

(57) ABSTRACT

A method for patterning a multi-layer film in a semiconductor device is provided. The semiconductor device comprises a substrate and a multi-layer film on the substrate. The multi-layer film comprises N conductive layers and N dielectric layers alternatingly stacked, and 2N contact plugs. The Nth dielectric layer is formed at the top of the multi-layer film. The distances between the centers of each adjacent contact plugs are the same.

15 Claims, 28 Drawing Sheets

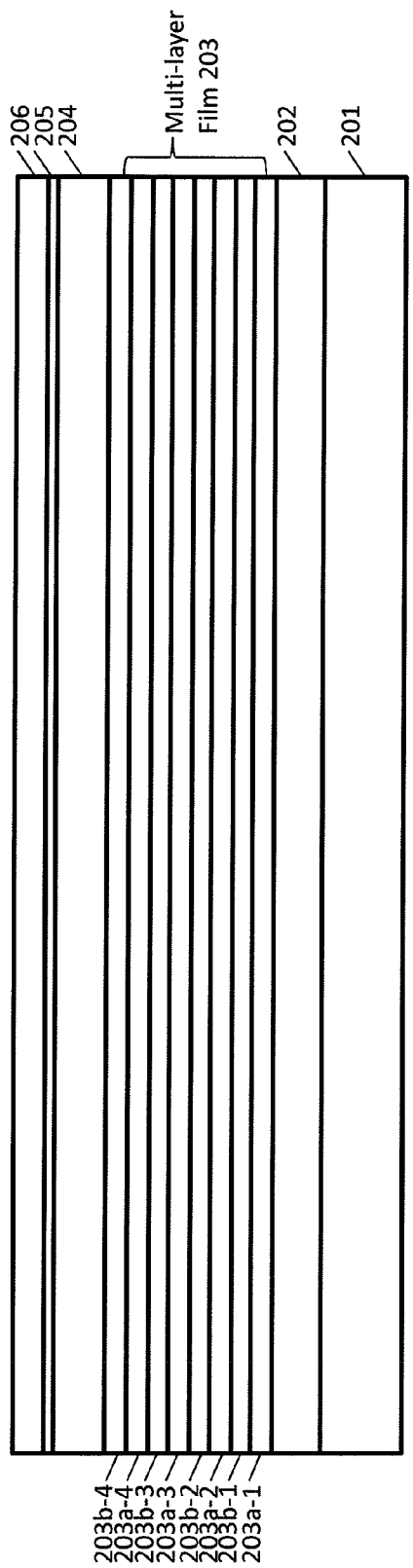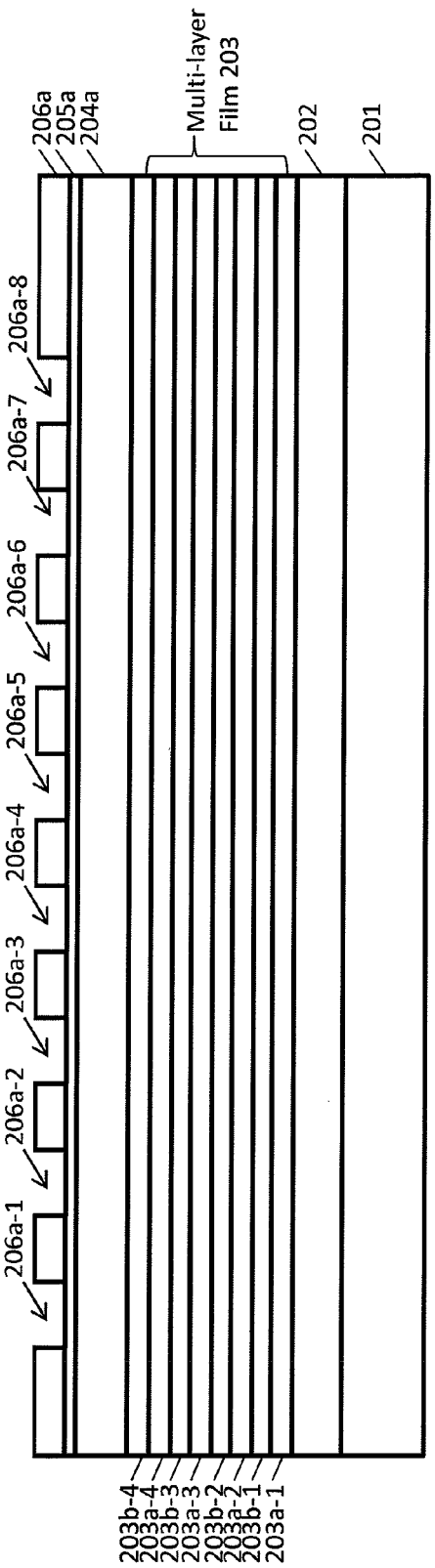
Fig. 1a
Fig. 1b

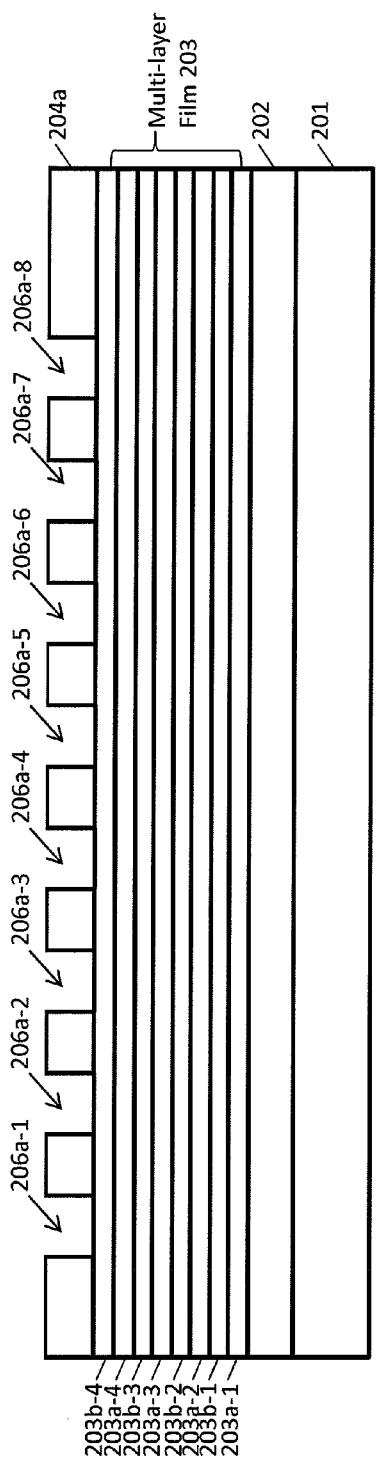
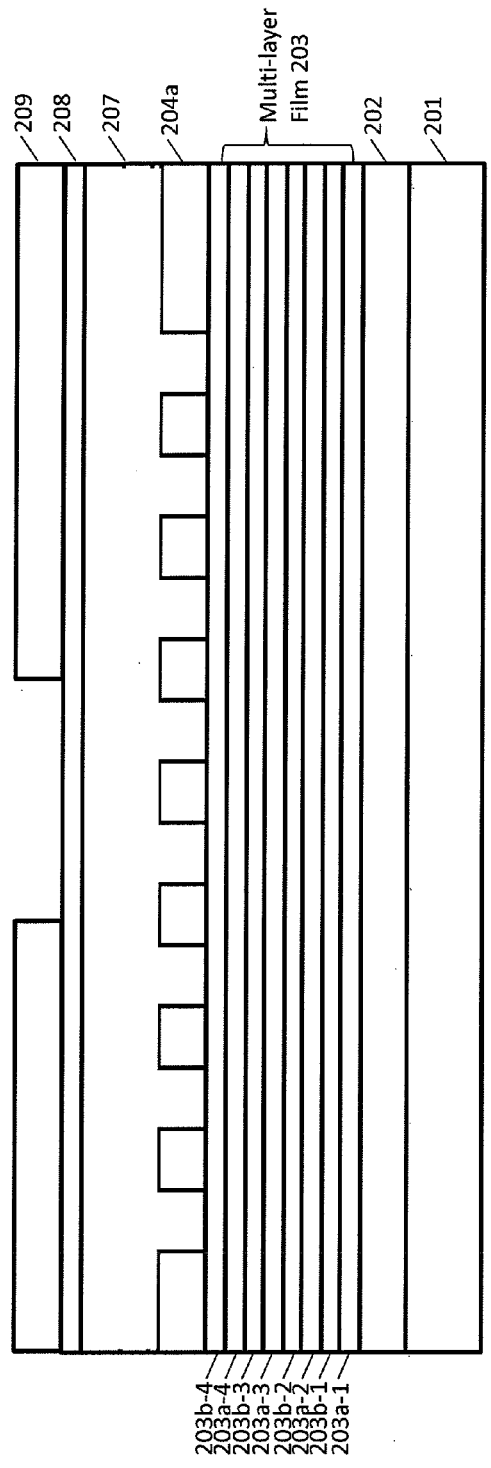
Fig. 1d
Fig. 1e

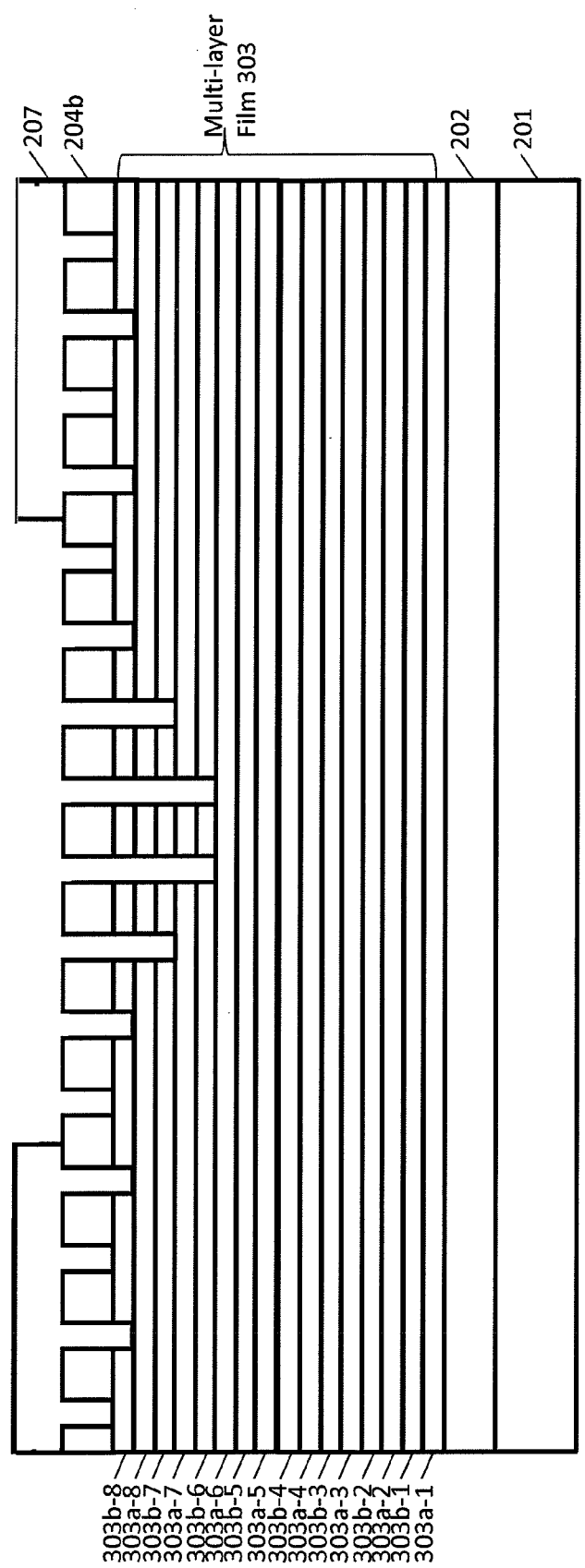

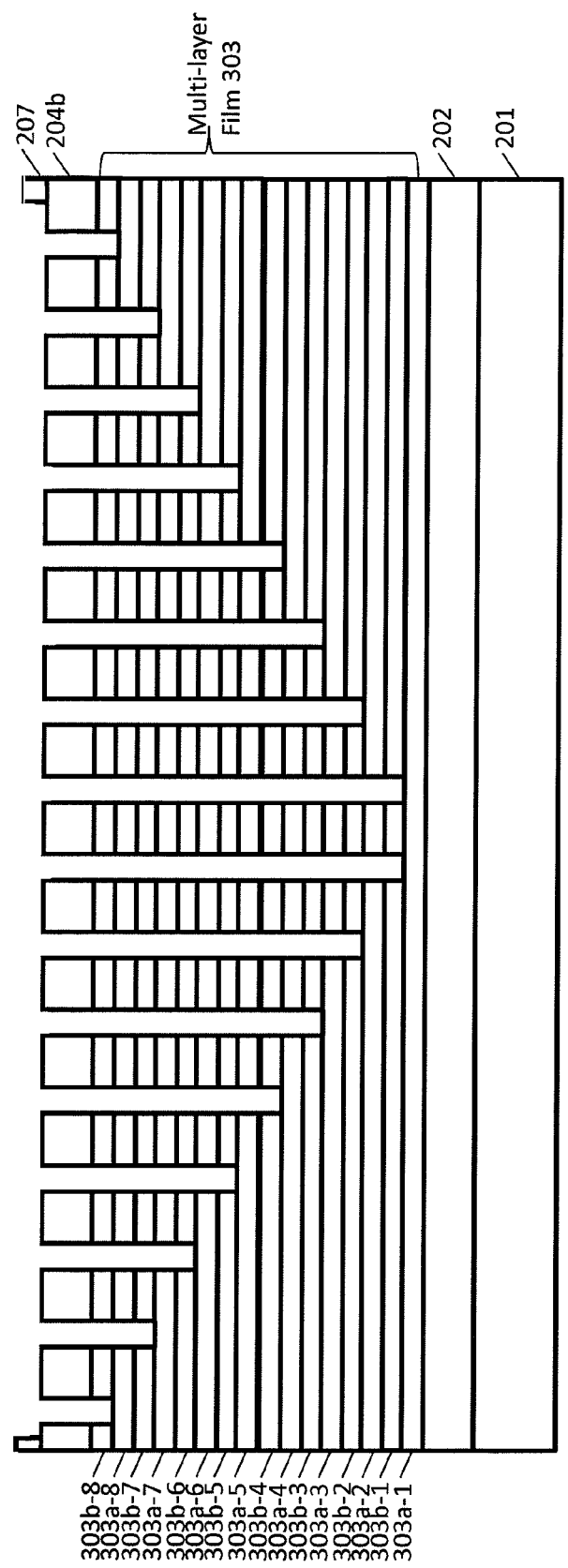

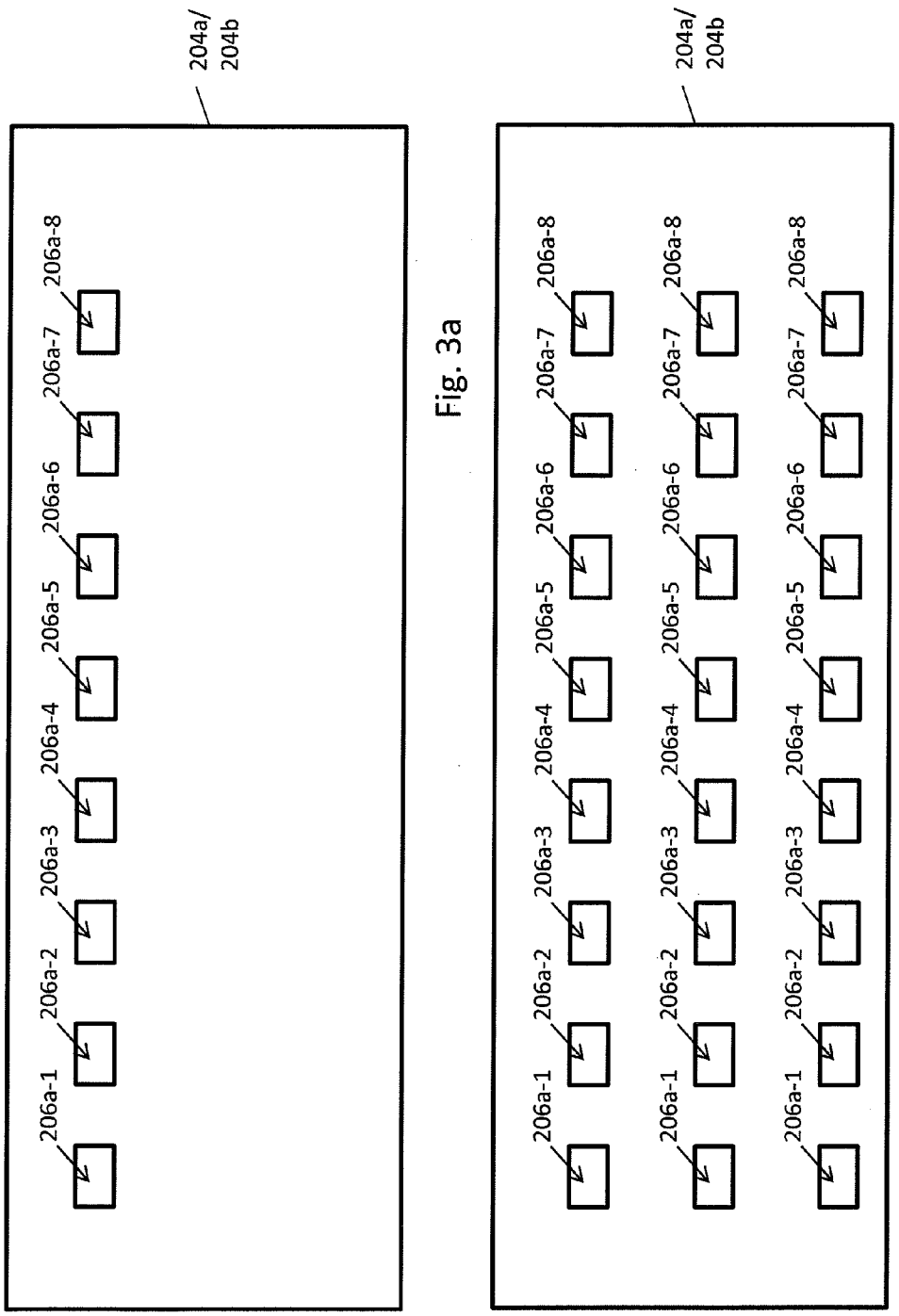

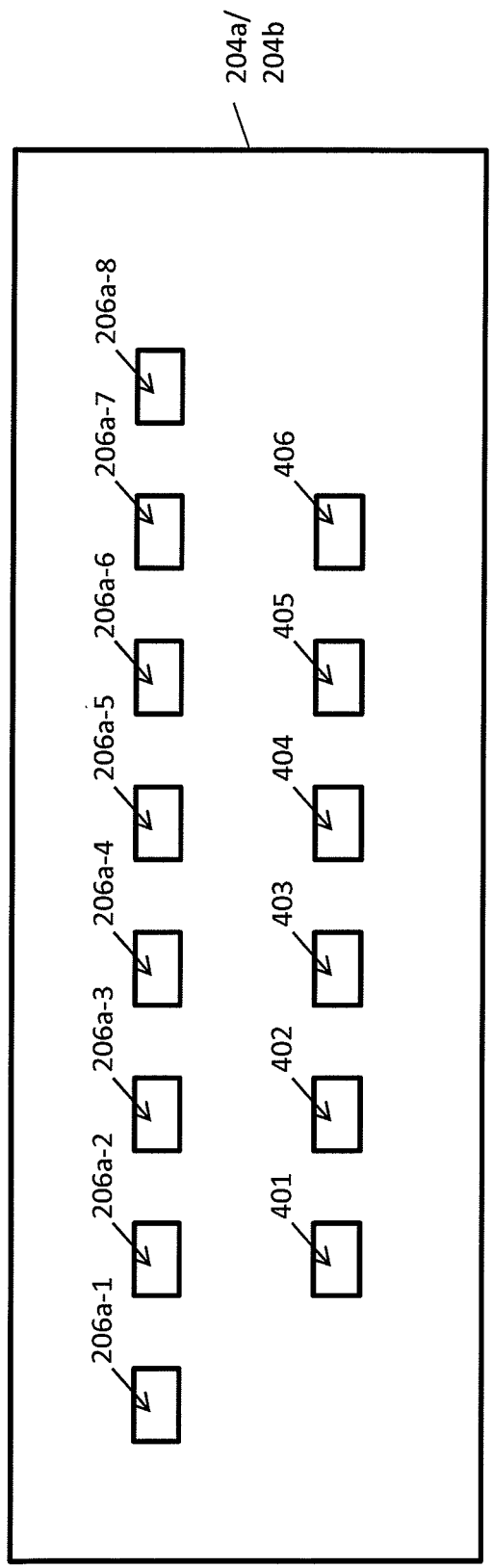

SEMICONDUCTOR DEVICES AND METHODS OF MANUFACTURING THE SAME

BACKGROUND OF THE INVENTION

The present invention generally relates to a method of manufacturing a high density semiconductor device, and the semiconductor device manufactured according to the method. More particularly, it relates to a method of patterning a multi-layer film during the fabrication of a semiconductor device, forming self-aligned plug holes, and the high density semiconductor device manufactured according to the method.

In the manufacture of ultra large scale integrated circuits, multi-level interconnects are commonly used to increase the density of the integrated circuits by reducing the layout area required for forming hundreds of thousands of semiconductor devices.

A conventional method for forming plug holes for a semiconductor device comprising a multi-layer film generally comprises the steps of forming one plug hole at a time with respect to each layer. Each time when a plug hole is to be formed, a patterned photoresist mask is formed on the multi-layer film for defining the location of the plug hole. The multi-layer film is then etched based on the patterned photoresist mask to form the plug hole. The steps of forming patterned photoresist mask and etching the multi-layer film are repeated for the formation of each plug hole. Next, oxide spacers are formed along the walls of the plug holes, defining space for a later fill-in of a conductive material into the plug holes, which results in conductive plugs accessible to different layers in the multi-layer film. Subsequently, when contact plugs for connecting wires of a wiring layer of the semiconductor device to the conductive plugs in the multi-layer film are to be formed, the patterned photoresist layer for defining the locations of the contact plugs need to be aligned with the conductive plugs formed in the multi-layer film. As a result, the conductive plugs and contact plugs are subject to a tight overlay specification. Furthermore, the pitches, which are the distances between the centers of adjacent plug holes, may vary since the each hole is defined by a different patterned photoresist layer. The cost associated with the method described above is also high.

As a result, it is desirable to provide a method for patterning a multi-layer film of a semiconductor device in an efficient and cost effective manner, and forming plug holes in the semiconductor device where the pitches are substantially the same.

BRIEF SUMMARY OF THE INVENTION

Examples of the present invention may provide a method for patterning a multi-layer film in a semiconductor device. The method comprises the steps of providing a substrate; forming the multi-layer film on the substrate, wherein the multi-layer film comprises N conductive layers and N dielectric layers alternatingly stacked and the N-th dielectric layer is formed at the top of the multi-layer film, N being a natural number; forming a patterned dielectric layer on the multi-layer film, wherein the patterned dielectric layer comprises 2N holes; forming a first polymer layer on the patterned dielectric layer; forming a first patterned photoresist layer on the first polymer layer, wherein the first patterned photoresist layer comprises a hole over the N-th and the (N+1)-th holes of the patterned dielectric layer; etching through the first polymer layer and the multi-layer film based on the first patterned photoresist layer, such that the $N_1$-th and the $(N_2+1)$-th holes of the dielectric layer are exposed, and the exposed holes expose a portion of the Nth conductive layer, where $N_1=N_2=N$; and repeating the steps of etching the first polymer layer such that the $(N_1-1)$-th and the $(N_2+2)$-th holes of the patterned dielectric layer are exposed, etching the multi-layer film based on the exposed portions of the patterned dielectric layer by first etching back the exposed conductive layers, and then etching back the exposed dielectric layers, decreasing $N_1$ by 1, and increasing $N_2$ by 1, until $N_1-1$ is less than 0.

Some examples of the present invention may provide a method for patterning a multi-layer film in a semiconductor device. The method comprises the steps of providing a substrate; forming the multi-layer film on the substrate, wherein the multi-layer film comprises N conductive layers and N dielectric layers alternatingly stacked and the Nth dielectric layer is formed at the top of the multi-layer film, N being a natural number; forming a patterned dielectric layer on the multi-layer film, wherein the patterned dielectric layer comprises 2N holes; forming a first anti-reflective layer on the patterned dielectric layer; forming a first patterned photoresist layer on the first anti-reflective layer, wherein the first patterned photoresist layer comprises a hole over each of the even-numbered holes of the 1st to $N_1$th holes of the patterned dielectric layer, and a hole over each of the odd-numbered holes of the $(N_2+1)$-th to 2Nth holes of the patterned N+1 th dielectric layer, where $N_1=N_2=N$; etching the first anti-reflective layer based on the first patterned photoresist layer; removing the first patterned photoresist layer and the remaining first anti-reflective layer; forming a first polymer layer on the patterned dielectric layer; forming a second patterned photoresist layer on the first polymer layer, wherein the second patterned photoresist layer comprises a hole over the $(N_1-1)$-th, $N_1$th, $(N_2+1)$-th and N+2th holes of the patterned dielectric layer; etching through the first polymer layer based on the second patterned photoresist layer, such that the $(N_1-1)$-th, $N_1$th, $(N_2+1)$-th and $(N_2+2)$-th holes of the patterned dielectric layer are exposed; etching the multi-layer film based on the exposed patterned dielectric layer, such that the $N_1$th and $(N_2+1)$-th holes expose a portion of the (N−2)-th conductive layer, and the $(N_1-1)$-th and $(N_2+2)$-th holes expose a portion of the (N−1)-th conductive layer; and repeating the steps of etching the first polymer layer such that the $(N_1-2)$-th, $(N_1-3)$-th, $(N_2+3)$-th and $(N_2+4)$-th holes of the patterned dielectric layer are exposed; etching the multi-layer film based on the exposed patterned dielectric layer by first etching away the exposed conductive layers, and subsequently etching away portions of two of the N dielectric layers and one of the N conductive layers exposed by each hole; decreasing $N_1$ by 2; and increasing $N_2$ by 2; until $N_1-2$ is less than 0.

Some other examples of the present invention may provide a semiconductor device comprises a substrate; an insulator on the substrate and a multi-layer film on the substrate. The multi-layer film comprises N conductive layers and N dielectric layers alternatingly stacked, and 2N contact plugs. The Nth dielectric layer is formed at the top of the multi-layer film. The distances between the centers of each adjacent contact plugs are the same.

Yet some other examples of the present invention may provide a method for patterning a multi-layer film in a semiconductor device. The method comprises the steps of providing a substrate; forming the multi-layer film on the substrate, wherein the multi-layer film comprises a plurality of conductive layers and a plurality of dielectric layers alternatingly stacked; forming a patterned dielectric layer on the multi-layer film, wherein the patterned dielectric layer comprises a plurality of holes; forming a patterned first polymer layer on the patterned dielectric layer, wherein the patterned first polymer layer comprise a first opening which exposes at least one first hole of the holes in the patterned dielectric layer; etching the multi-layer film through the first opening to form a first contact hole under each of the exposed first hole(s) of the patterned dielectric layer; forming a second opening in the patterned polymer layer to expose at least one second hole of the holes in the patterned dielectric layer; etching the the multi-layer film through the first opening and the second opening to form a second contact hole under each of the exposed second hole(s) in the patterned dielectric layer, and to etch each of the first contact hole(s) deeper, wherein the first contact hole(s) is deeper than the second contact hole(s).

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings:

FIGS. 1a to 1k illustrate an exemplary method for patterning a multi-layer film of a semiconductor device according to the present invention.

FIG. 3a illustrate a schematic diagram of the top view of an exemplary etch mask according to the present invention.

FIG. 3b illustrate a schematic diagram of the top view of another exemplary etch mask according to the present invention.

FIG. 3c illustrate a schematic diagram of the top view of some other exemplary etch mask according to the present invention.

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale.

An exemplary method for patterning a multi-layer film of a semiconductor device according to the present invention will now be described in reference to FIGS. 1a to 1k.

FIGS. 1a illustrates a multi-layer film 203 formed on a substrate 201. The multi-layer film 203 comprises four conductive layers 203a-1, 203a-2, 203a-3, 203a-4 and four dielectric layers 203b-1, 203b-2, 203b-3, 203b-4 stacked over a substrate 201 in an alternating manner, with one of the dielectric layers 203b-4 formed at the top. The conductive layers 203a-1, 203a-2, 203a-3, 203a-4 may comprise poly silicon, and the dielectric layers 203b-1, 203b-2, 203b-3, 203b-4 may comprise silicon oxide. An insulator layer 202 is provided on the substrate 201 for isolating the multi-layer film 203 from the substrate 201. The insulator layer 202 may comprise a silicon oxide or an oxide-nitride-oxide (ONO) layer.

Figure 1C:
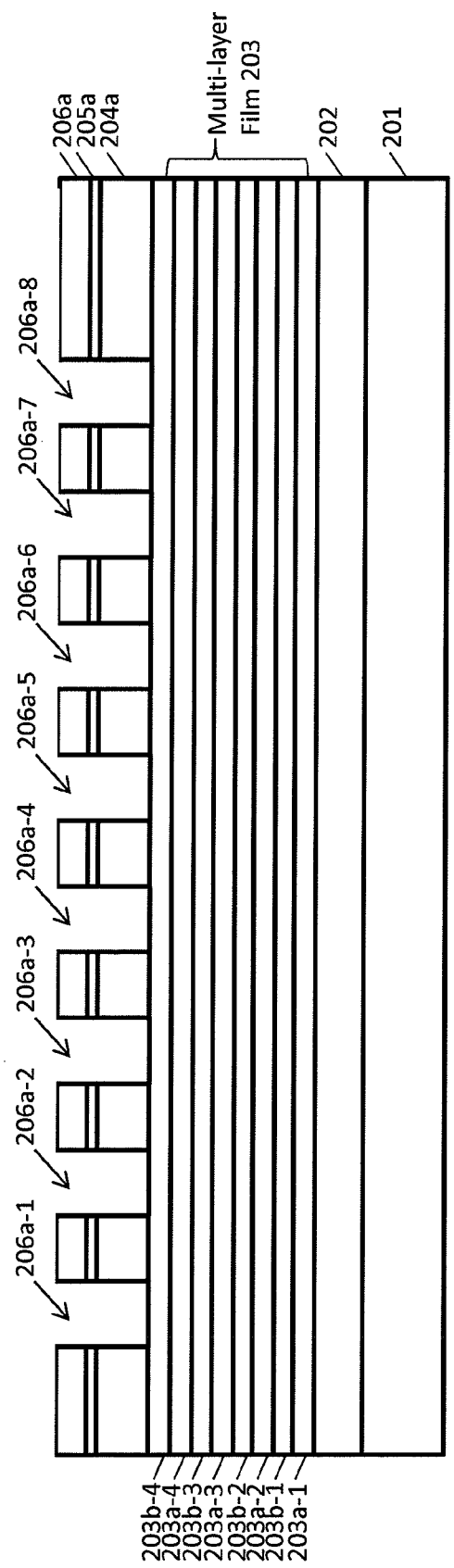

In order to pattern the multi-layer film 203 using a self-align process, an etch mask 204a, as shown in FIG. 1c, is formed. The etch mask 204a comprises a plurality of holes defining the locations and the size of the contact holes. The configuration of the holes in the etch mask 204a may vary depending on the configuration of the semiconductor device. Some exemplary patterns of the etch mask 204a are shown in FIGS. 3a to 3c. The present exemplary method is described in accordance with the exemplary etch mask 204a as shown in FIG. 3a or 3b.

To form the etch mask 204a, a dielectric layer 204, which may comprise silicon nitride, may be provided on the multi-layer film 203. Subsequently, an anti-reflective layer 205 and a first photoresist layer 206 are sequentially provided on the dielectric layer 204. The first photoresist layer 206 is patterned so as to define the locations of contact holes 206a-1 to 206a-8. In accordance with one example of the present invention, the first photoresist layer 206 comprises at least one set of holes 206a-1 to 206a-8. Each set of holes comprises 8 holes, namely 206a-1 to 2-6a-8 as shown in FIG. 1b. Subsequently, as shown in FIG. 1c, the dielectric layer 204 is etched based on the patterned first photoresist layer 206a, resulting in the etch mask 204a. The patterned first photoresist layer 206a and the remaining anti-reflective layer 205a are removed as shown in FIG. 1d.

Figure 1F:
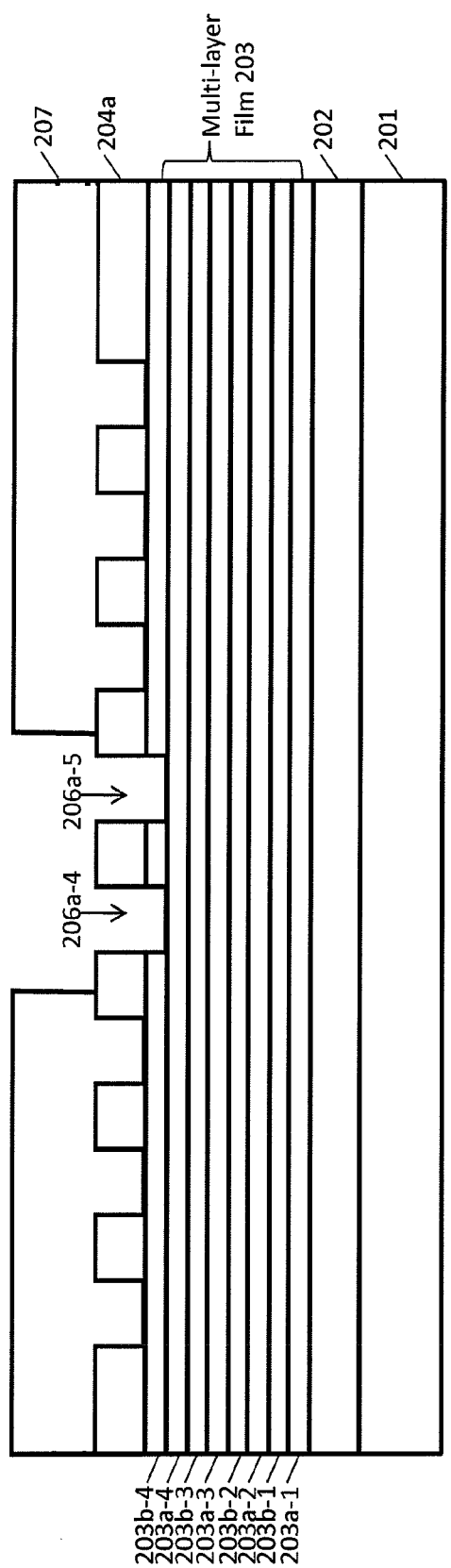

FIG. 1e shows a tri-layer film formed on the patterned dielectric layer 204a. The tri-layer film comprises two polymer layers 207 and 208 and a photoresist layer 209. The first polymer layer 207 may comprise a polymer which has a high carbon concentration. For example, the first polymer may comprise Organic high carbon Density Layer (ODL) material. The second polymer layer 208 may comprise a polymer which has a high silicon concentration, such as High Silicon contain Hard mask Bottom Anti-Reflective Coating. The photoresist layer 209 is patterned in a way so that a hole is formed therein at a location over the two holes located at the center of the patterned dielectric layer 204a. As shown in FIG. 1f, the first and second polymer layers 207 and 208 are etched based on the patterned photoresist layer 209. Moreover, a portion of the patterned dielectric layer 204a is exposed. Furthermore, the dielectric layer 203b-4 at the top of the multi-layer film 203 is etched based on the exposed portion of the patterned dielectric layer 204a. In addition, the second polymer layer 208 is etched away during the above etching processes.

Figure 1G:
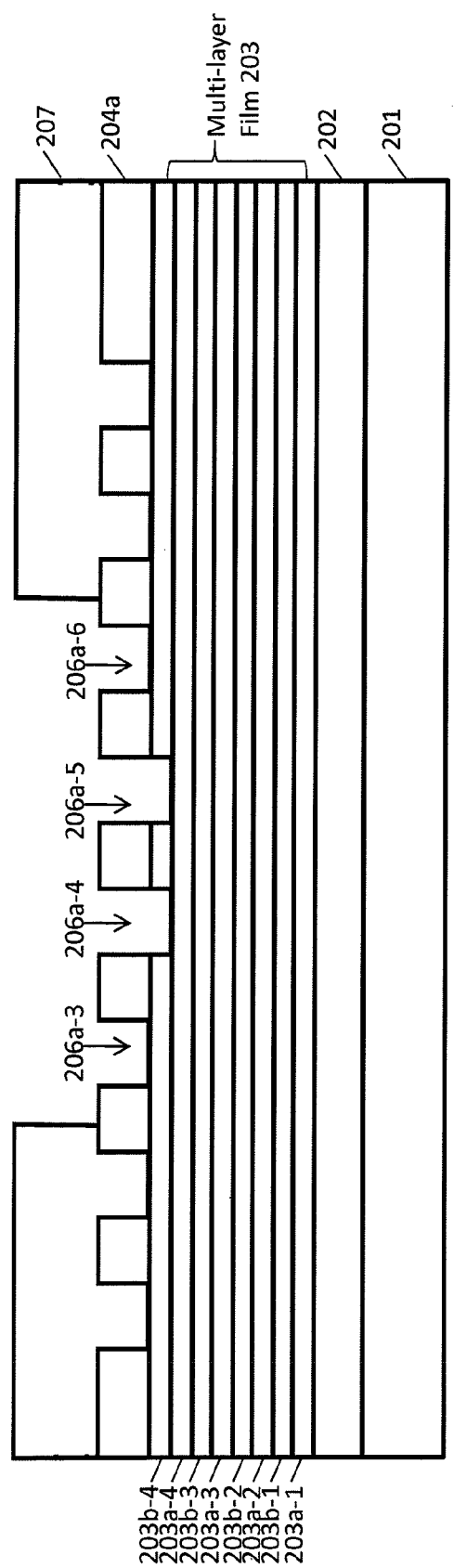
Figure 1H:
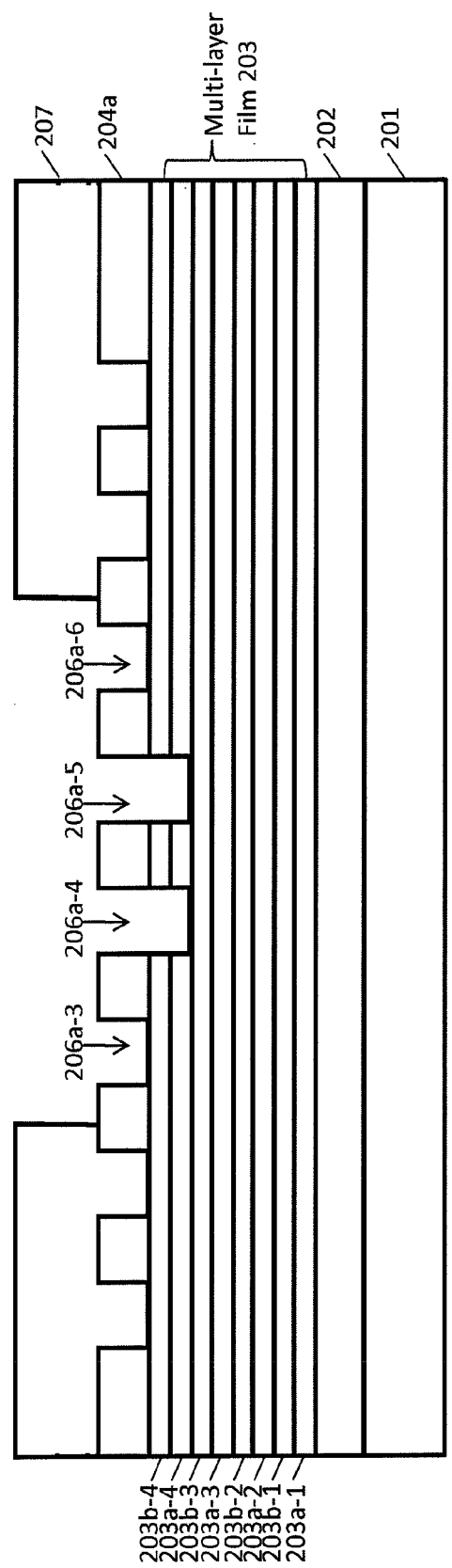

Subsequently, as shown in FIG. 1g, the first polymer 207 is etched away so as to expose two holes 206a-3 and 206a-6 of the patterned dielectric layer 204a that are adjacent to the already exposed holes 206a-4 and 206a-5. The etching processing may be carried out by, for example, dry etching with appropriately selected plasma in view of the material of the first polymer 207. The etching system's ability to do this depends on selecting the appropriate plasma based on the ratio of etch rates in the first polymer 207 and the patterned dielectric layer 204a. Following etch step, a portion of the conductive layer 203a-4 exposed by the two holes 206a-4 and 206a-5 located at the center of the patterned dielectric layer 204a are etched away based on the exposed portion of the patterned dielectric layer 204a as shown in FIG. 1h. Subsequently, portions of the dielectric layers 203b-3 and 203b-4 exposed by the exposed portions of the patterned dielectric layer 204a are etched away as shown in FIG. 1i.

Figure 1I:
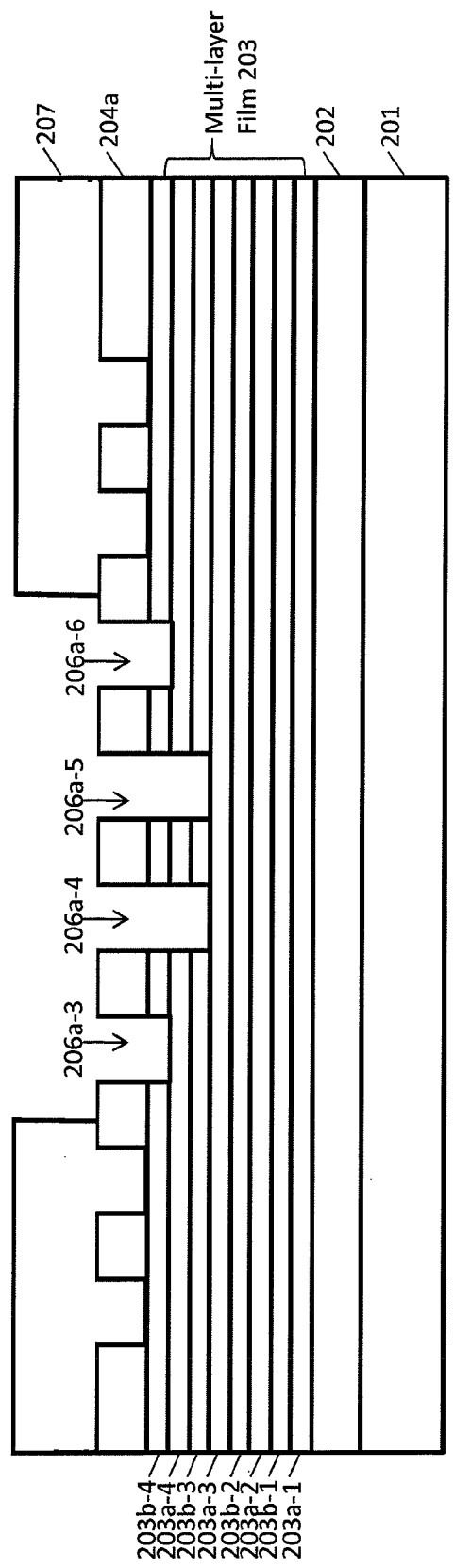
Figure 1J:
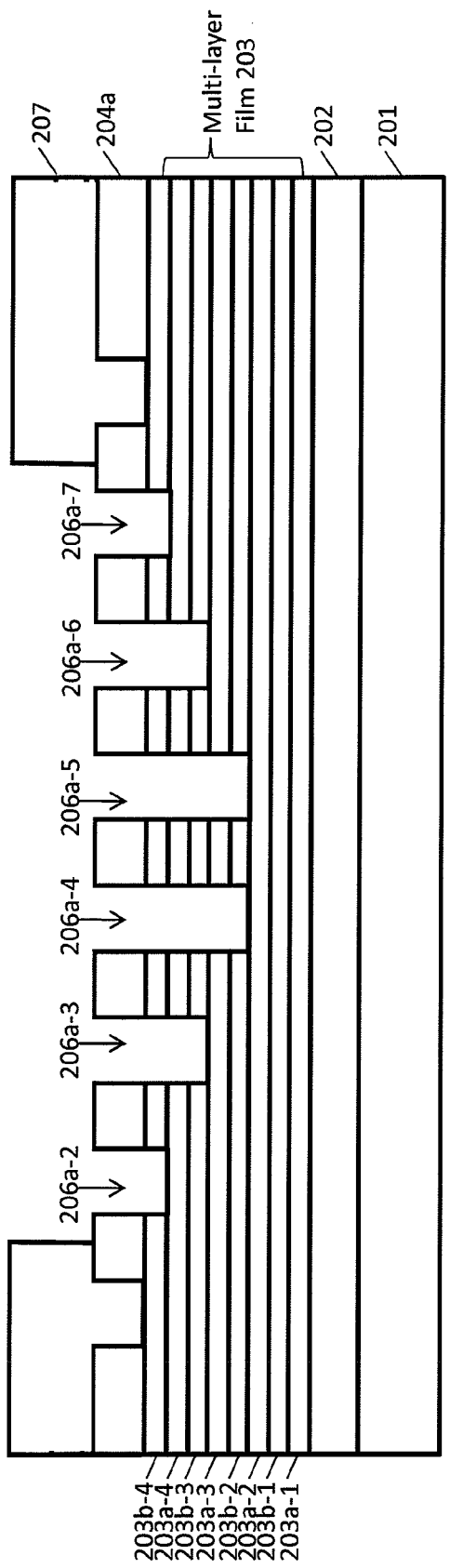
Figure 1K:
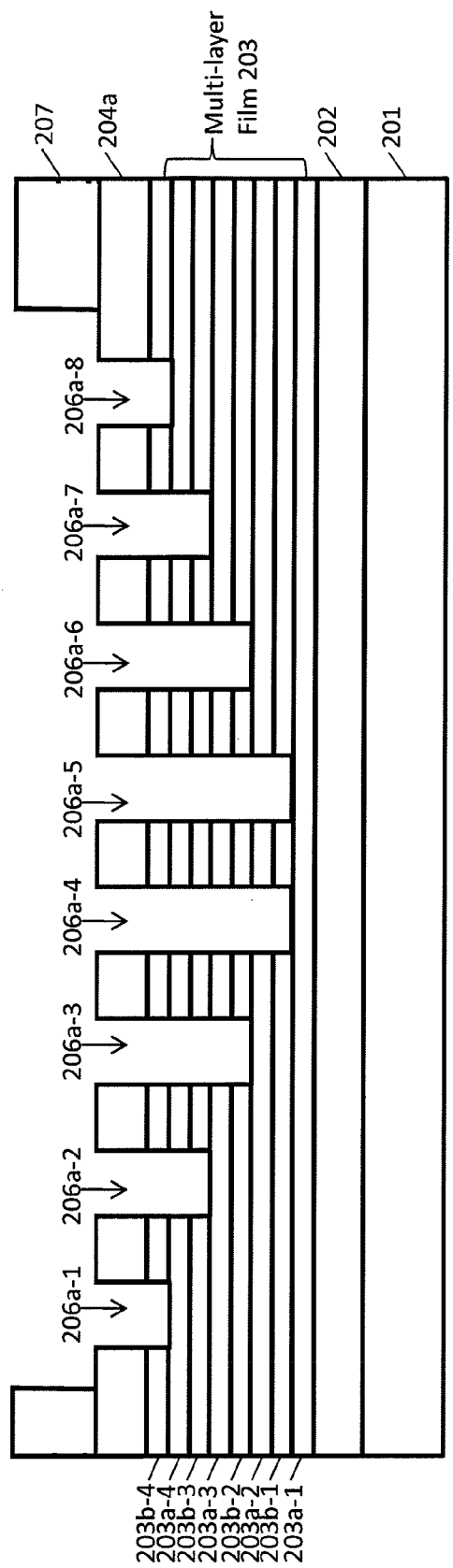

Steps similar to those described in reference to FIGS. 1g to 1i above are repeated to form the structures as shown in FIGS. 1j and 1k until a desired number of plug holes are formed in the multi-layer film 203. In the present example, given the four conductive layers 203a-1 to 203a-4 and the four dielectric layers 203b-1 to 203b-4, a total number of eight plug holes are formed. In other examples, however, the number of plug holes may be different as the number of the interleaving conductive layers and dielectric layers are different.

With the method described in reference to FIGS. 1a to 1k above, the multi-layer film 203 is patterned based on only one etch mask, which is the patterned dielectric layer 204a. As a result of this, the contact holes formed in the multi-layer film 203 are precisely aligned with the holes defined by the patterned first photoresist layer 206a. Therefore, when contact plugs are to be formed at a later stage, the contact plugs can be precisely aligned with the contact holes in the multi-layer film 203. As a result, the pitches between adjacent plug holes are substantially the same. In addition, the method according to the present invention forms multiple plug holes simultaneously. Therefore, in comparison to convention methods where the formation of each plug hole requires the steps of forming patterned photoresist layer etching back, the present invention provides a more cost effective and less time consuming method for patterning a multi-layer film.

Another exemplary method for patterning a multi-layer film of a semiconductor device according to the present invention will now be described in reference to FIGS. 2a to 2q.

Figure 2A:
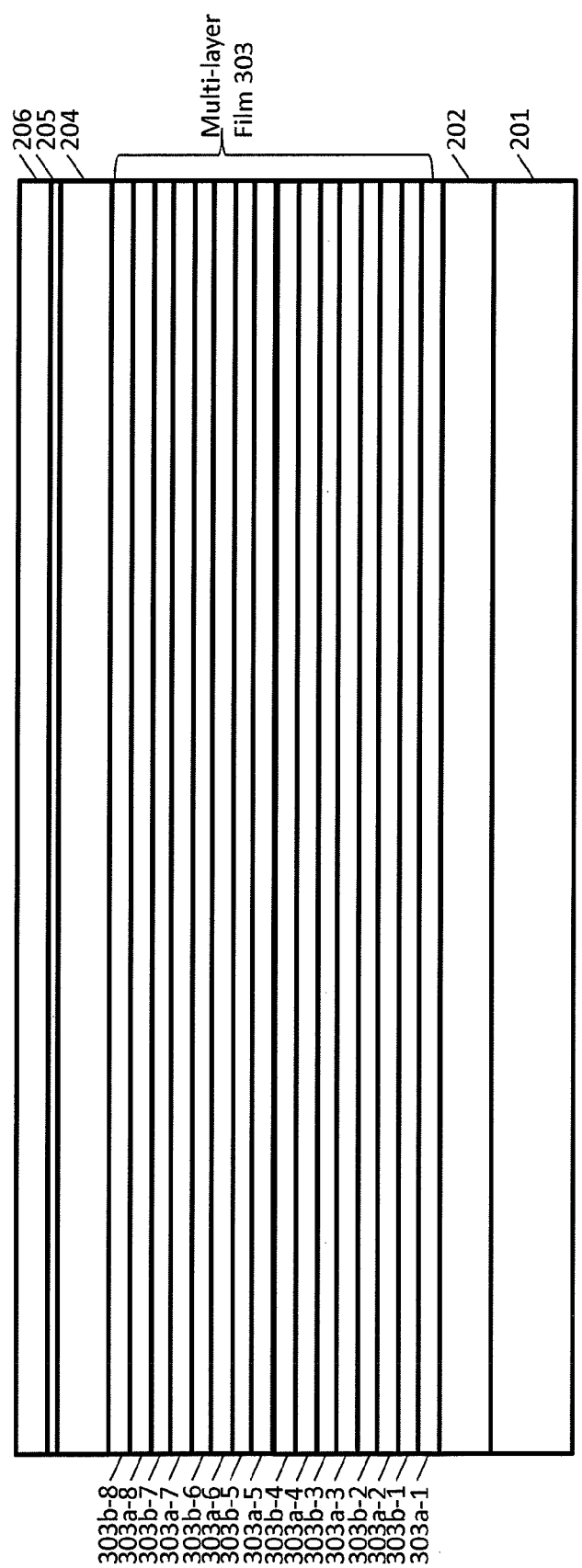
FIGS. 2a to 2q illustrate another exemplary method for patterning a multi-layer film of a semiconductor device according to the present invention.
Figure 2B:
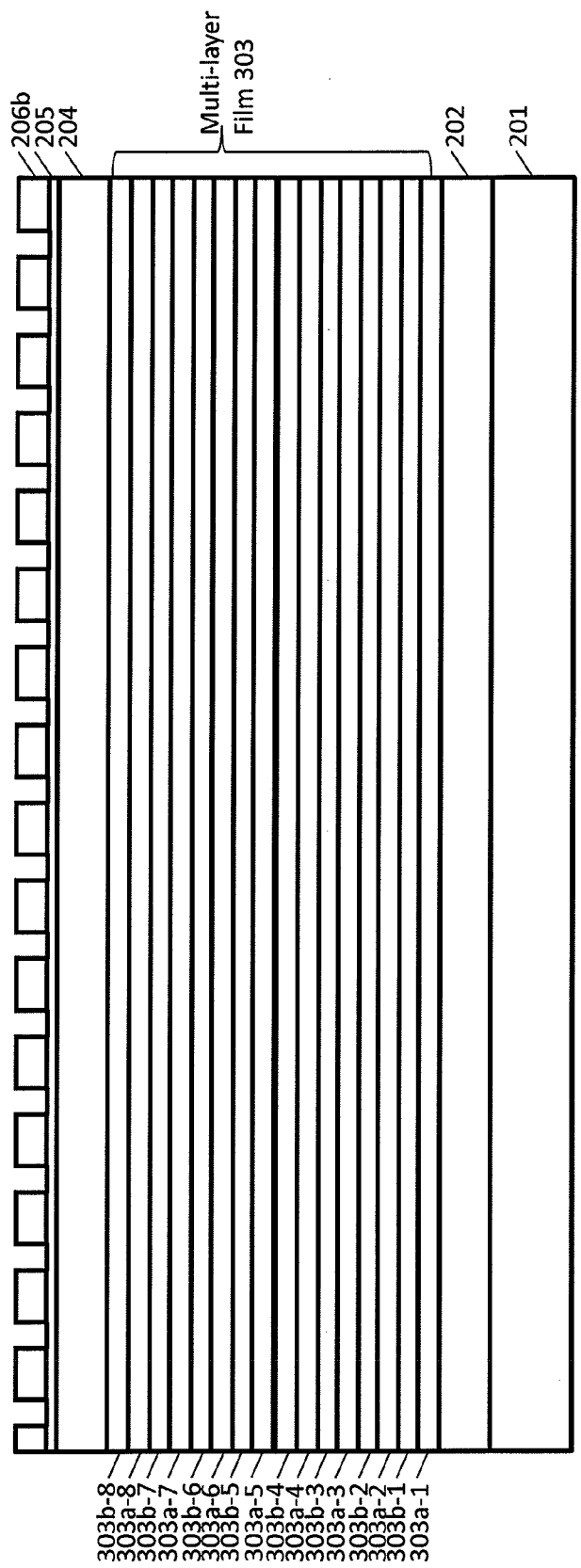

FIGS. 2a illustrates a multi-layer film 303 formed on a substrate 201. The multi-layer film 303 is similar to the multi-layer film 203 in the example illustrated in FIG. 1a, except that the multi-layer film 303 comprises eight conductive layers 303a-1, 303a-2, 303a-3, 303a-4, 303a-5, 303a-6, 303a-7, 303a-8 and eight dielectric layers 303b-1, 303b-2, 303b-3, 303b-4, 303b-5, 303b-6, 303b-7, 303b-8 stacked in an alternating manner, with one of the dielectric layers 303b-8 formed at the top.

Figure 2C:
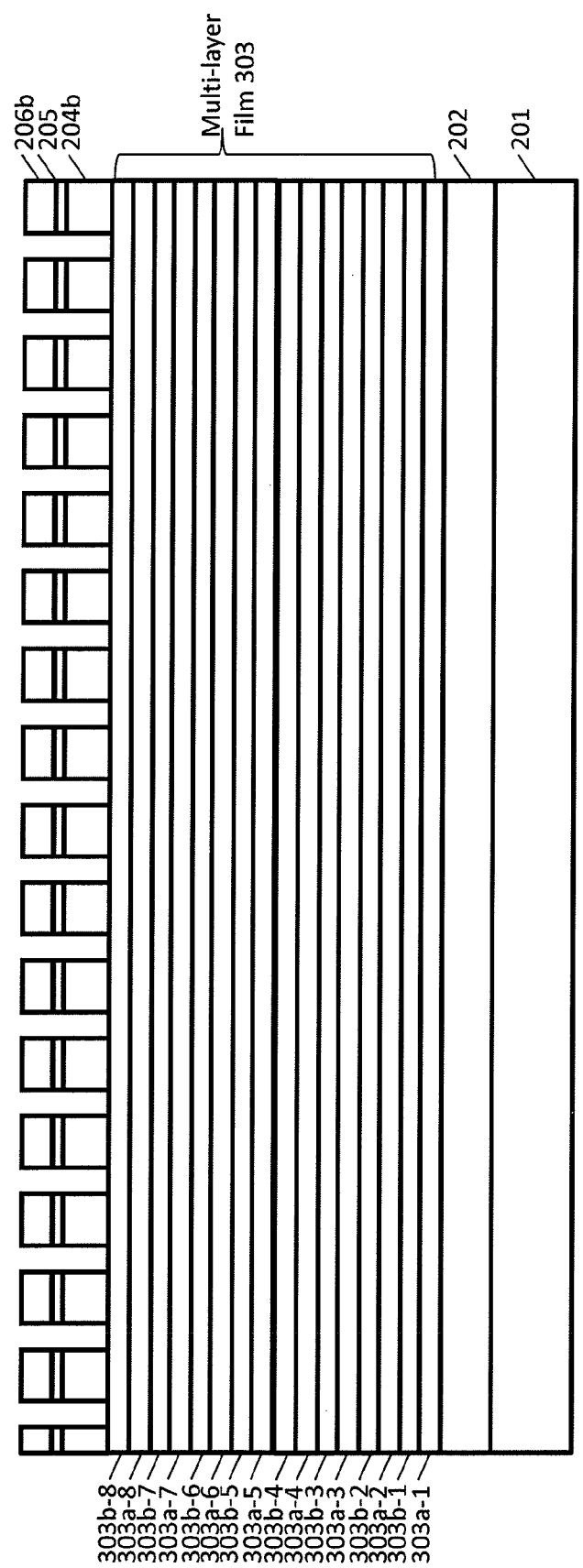
Figure 2D:
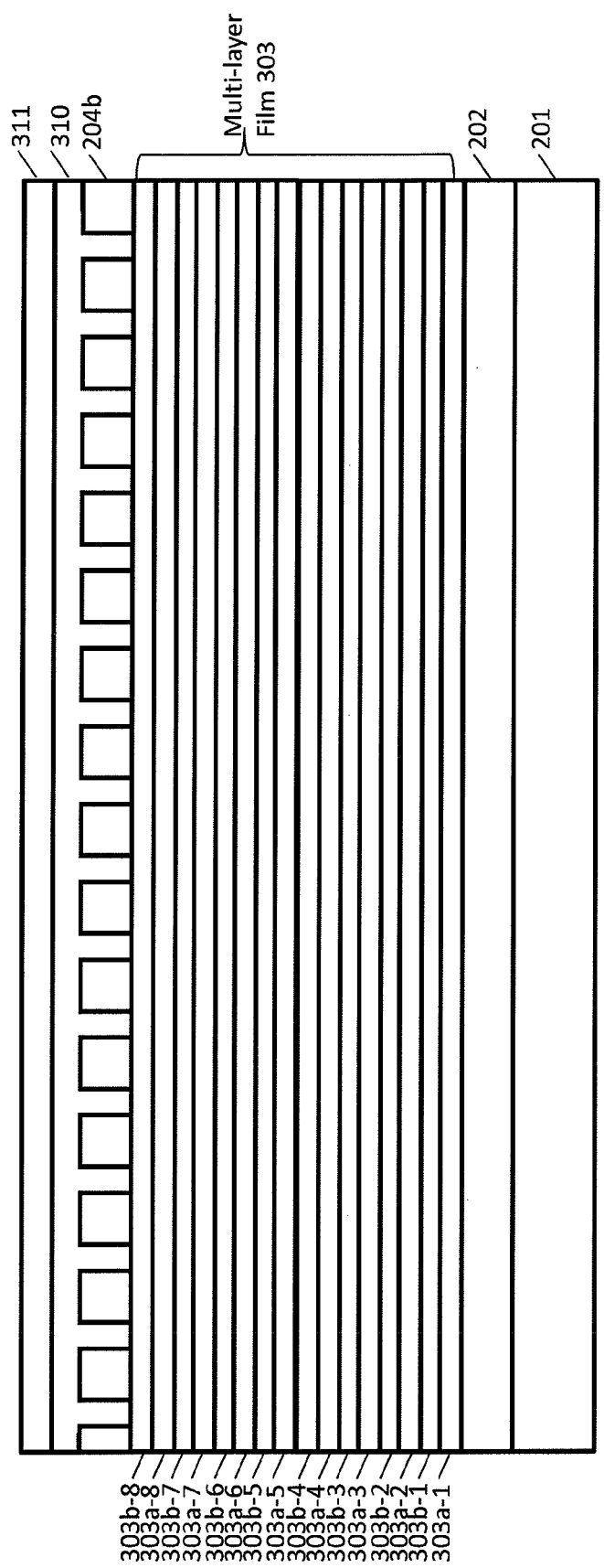
Figure 2E:
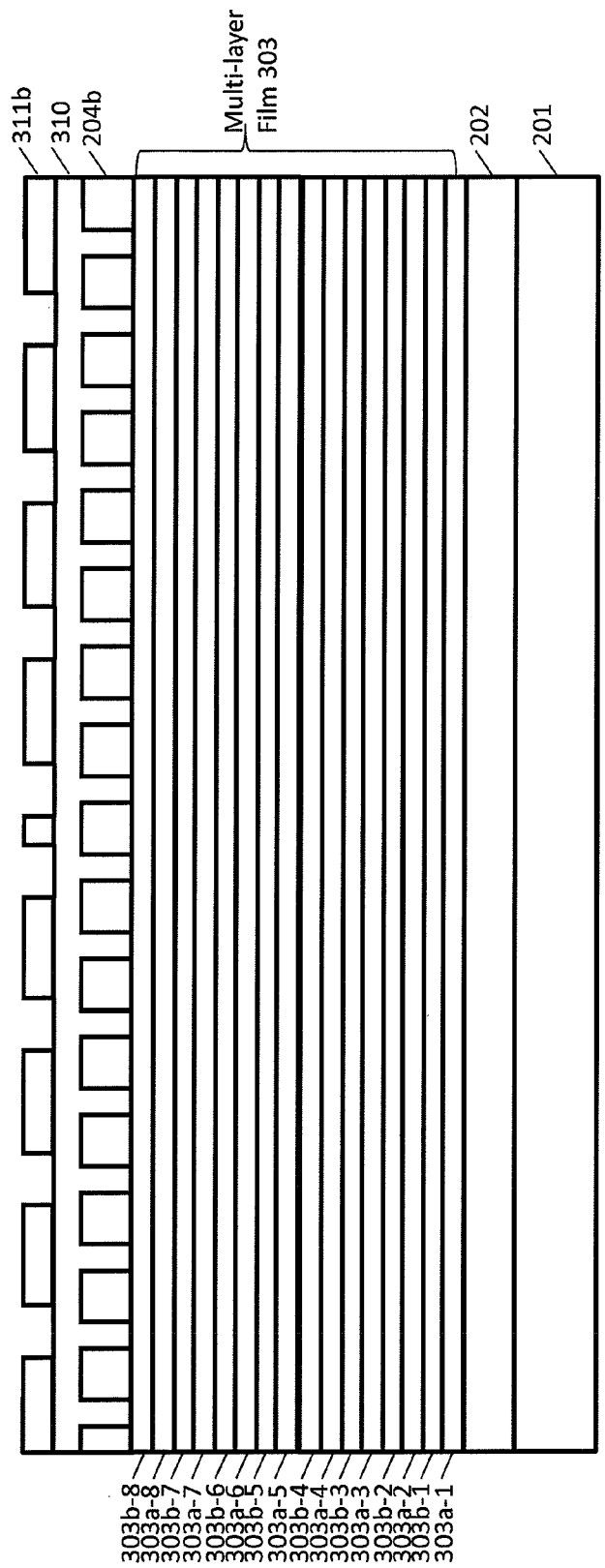
Figure 2F:
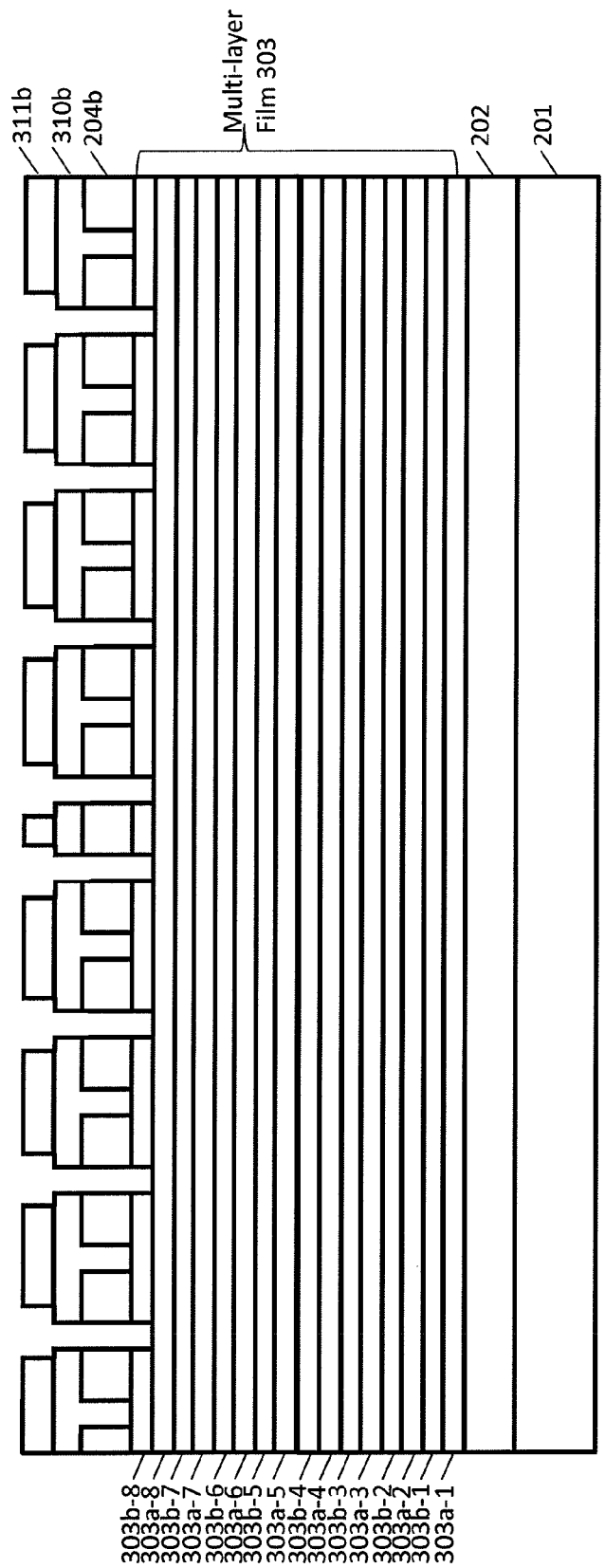

In order to pattern the multi-layer film 203 using a self-align process, an etch mask 204b, as shown in FIG. 2c is formed. The etch mask 204b is formed in a similar manner as that described in reference to FIGS. 1a to 1c, except the patterned dielectric layer 204b comprises 16 holes. Subsequently, FIG. 2d shows a second anti-reflective layer 310 is provided on the patterned dielectric layer 204b and a second photoresist layer 311 is provided on the second anti-reflective layer 310. As shown in FIG. 2e, the second photoresist layer 311 is patterned in a way such that when the second anti-reflective layer 310 is etched based on the patterned second photoresist layer 311b, the two holes located at the center of the set of holes in the patterned dielectric layer 204b, and every other hole in the set adjacent to the center holes may be exposed. Following the etching of the second anti-reflective layer 310, portions of the top dielectric layer 303b-8 of the multi-layer film 303 that are exposed by the exposed holes of the patterned dielectric layer 204b are etched as shown in FIG. 2f. Subsequently, the remaining patterned second photoresist layer 311b and second anti-reflective layer 310b are removed.

FIGS. 2g to 2q illustrate the steps for patterning the multi-layer film 303 using the patterned dielectric layer 204b as the etch mask.

Figure 2G:
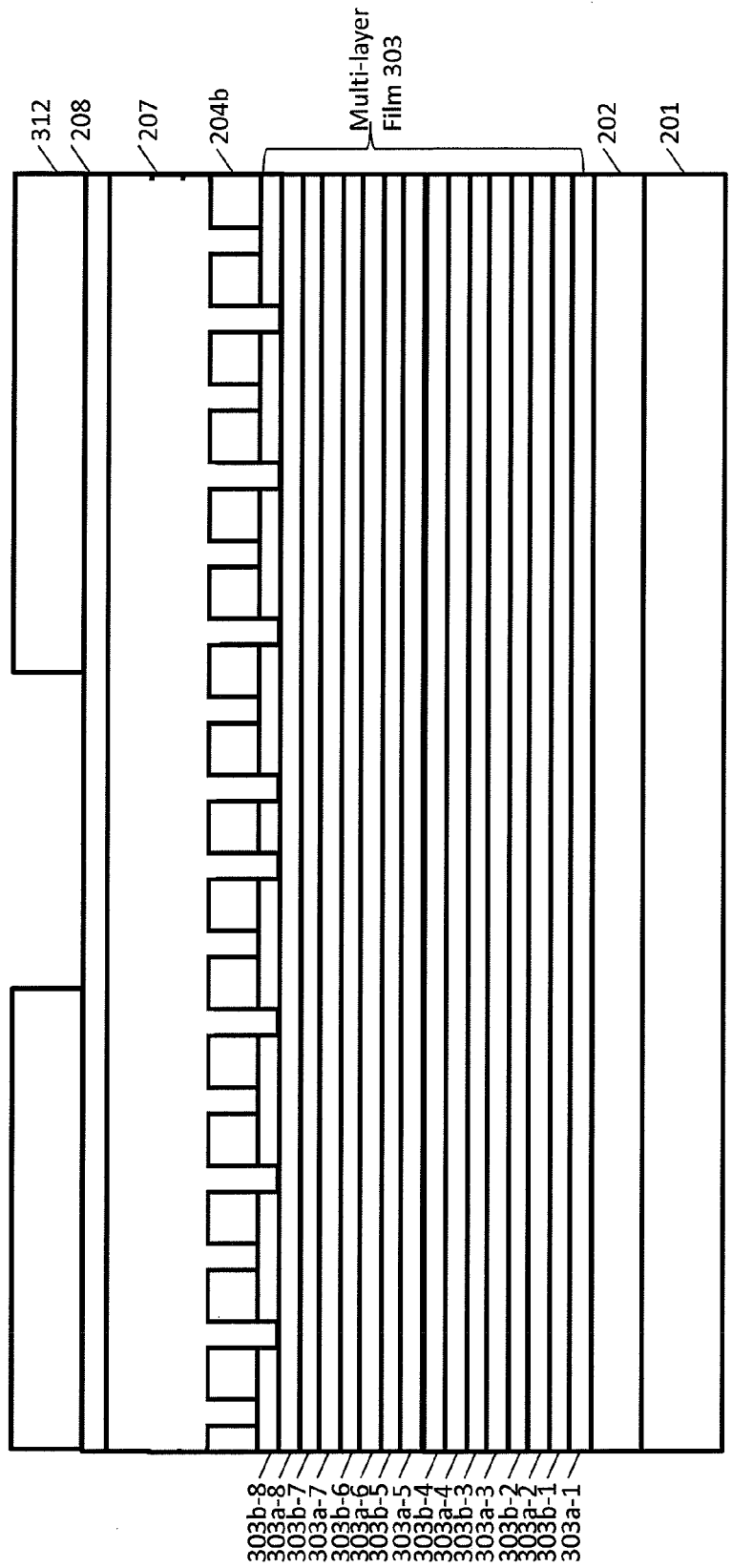
Figure 2H:
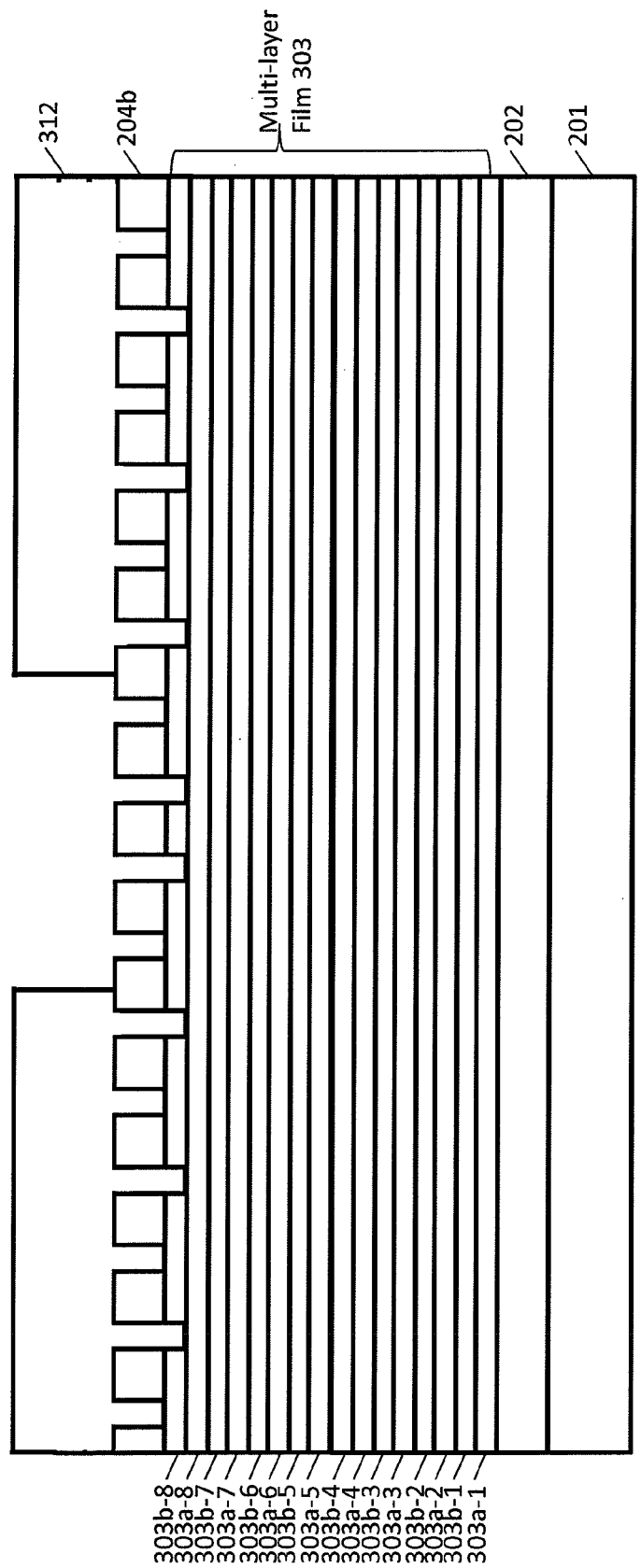
Figure 2I:
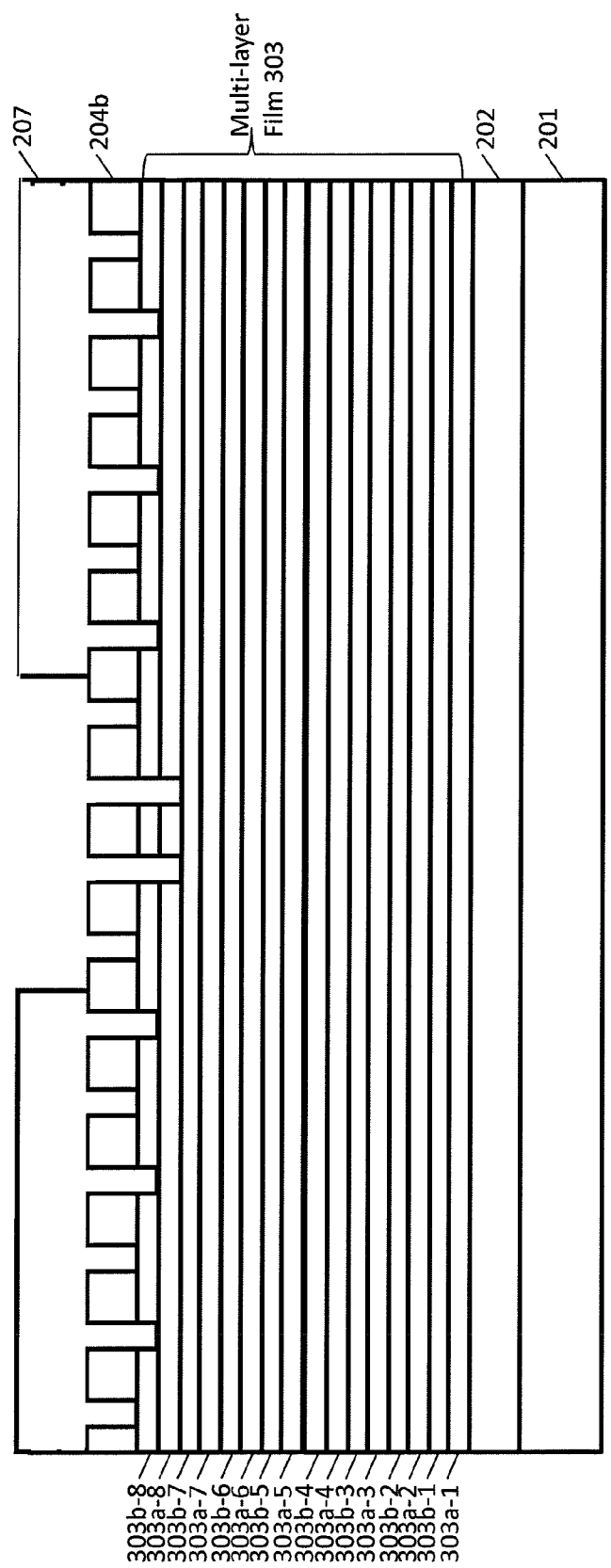
Figure 2J:
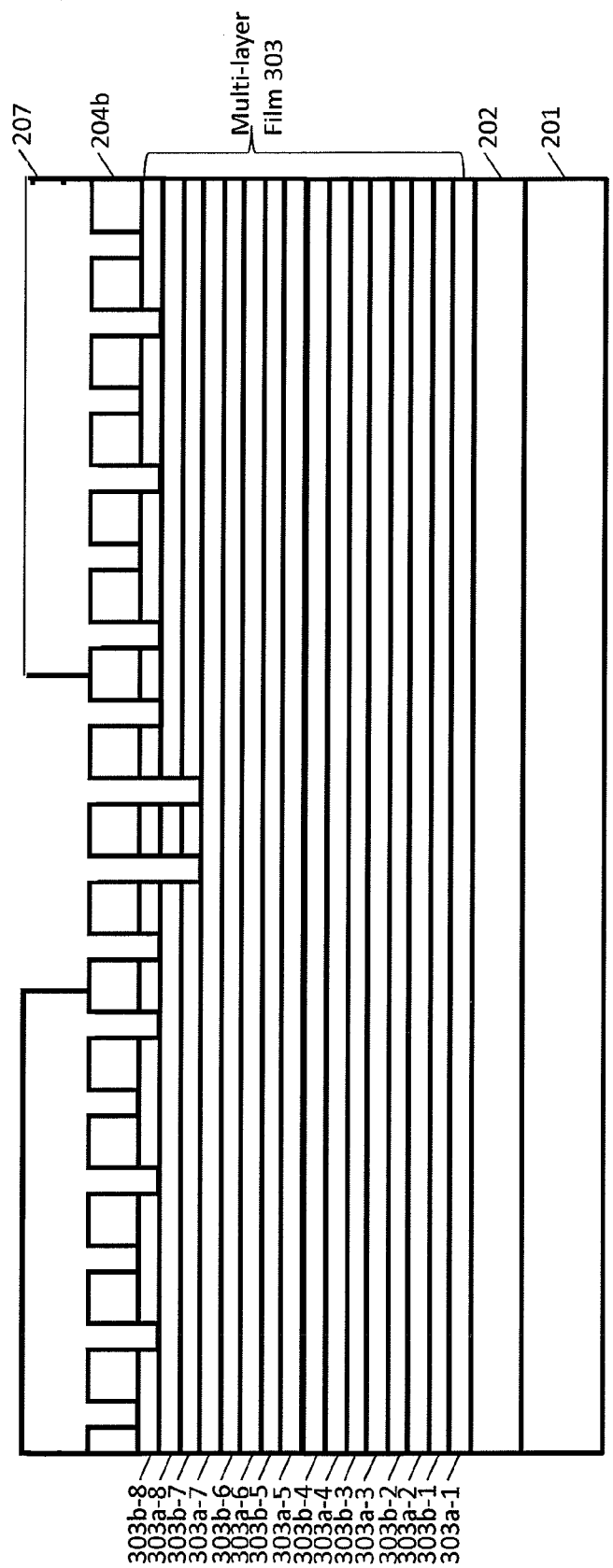
Figure 2K:
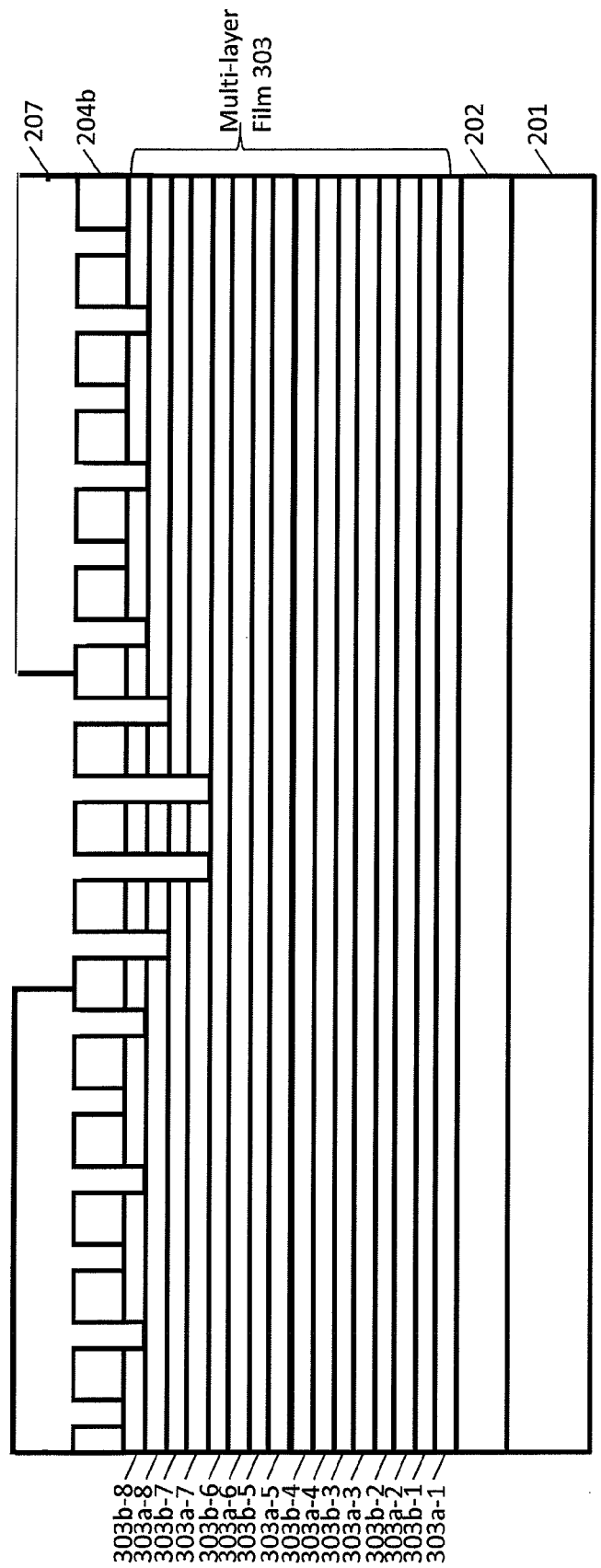
Figure 21:
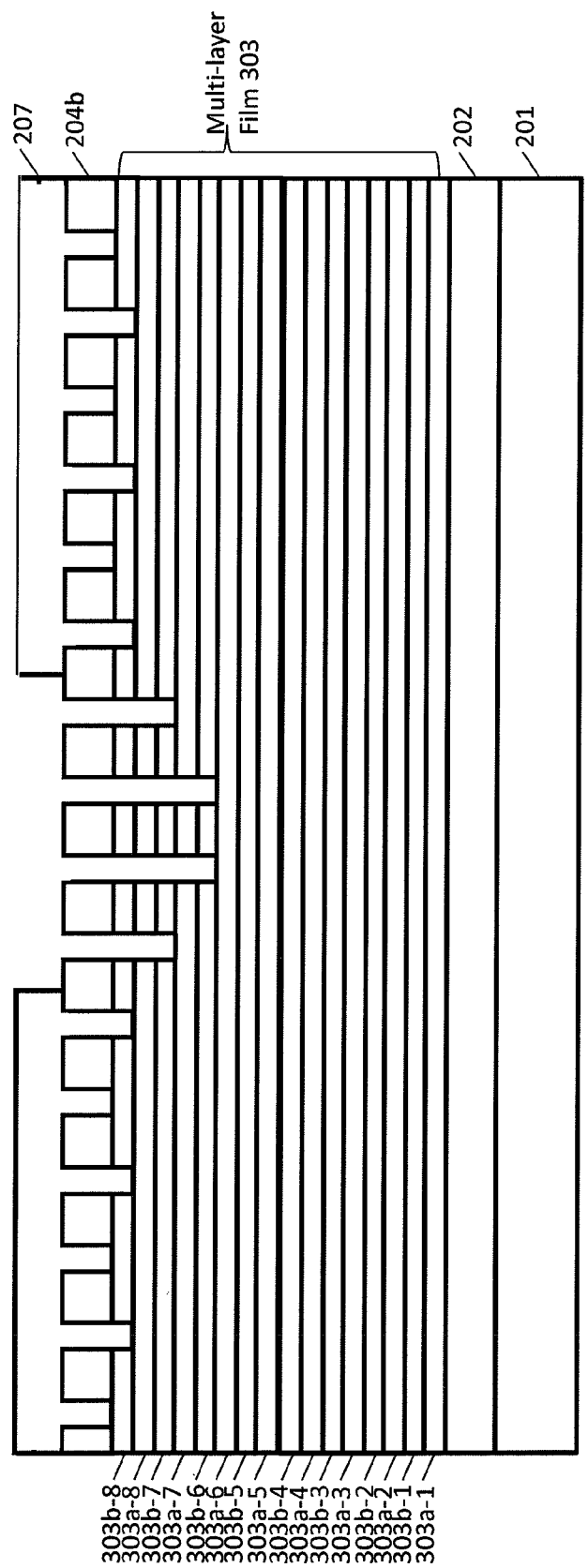
Figure 2N:
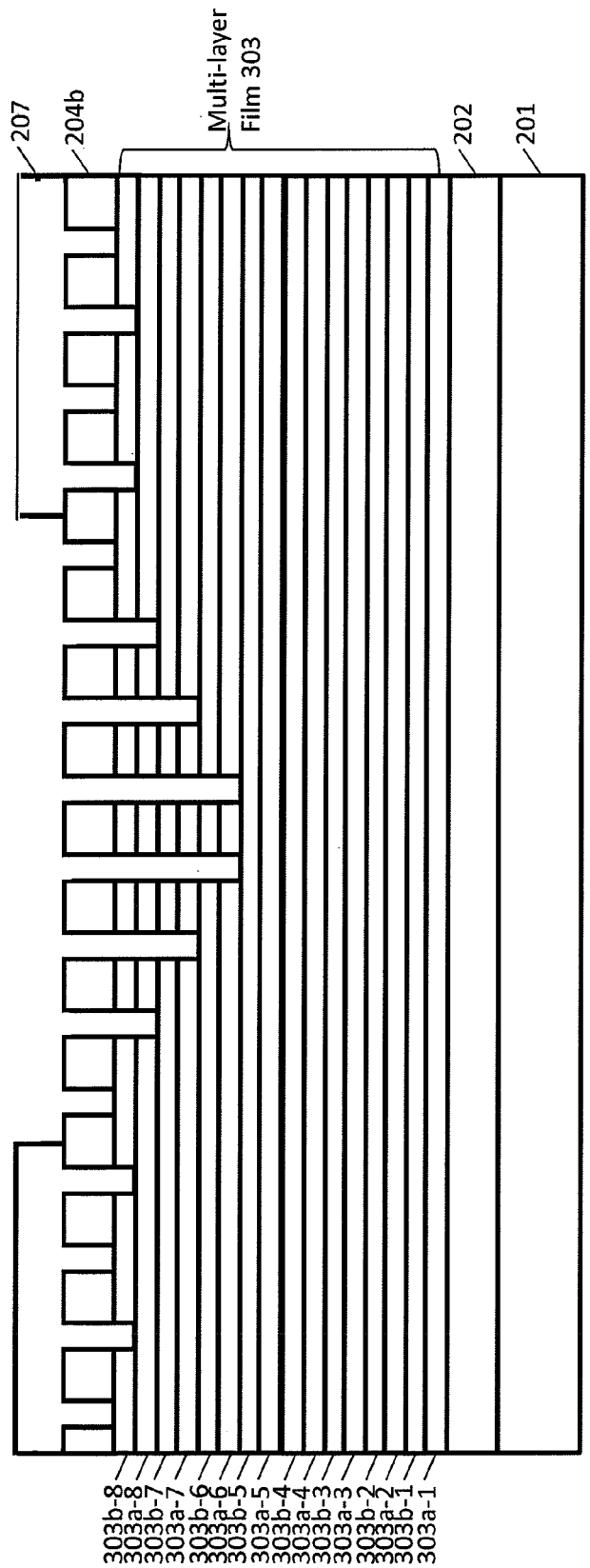
Figure 2O:
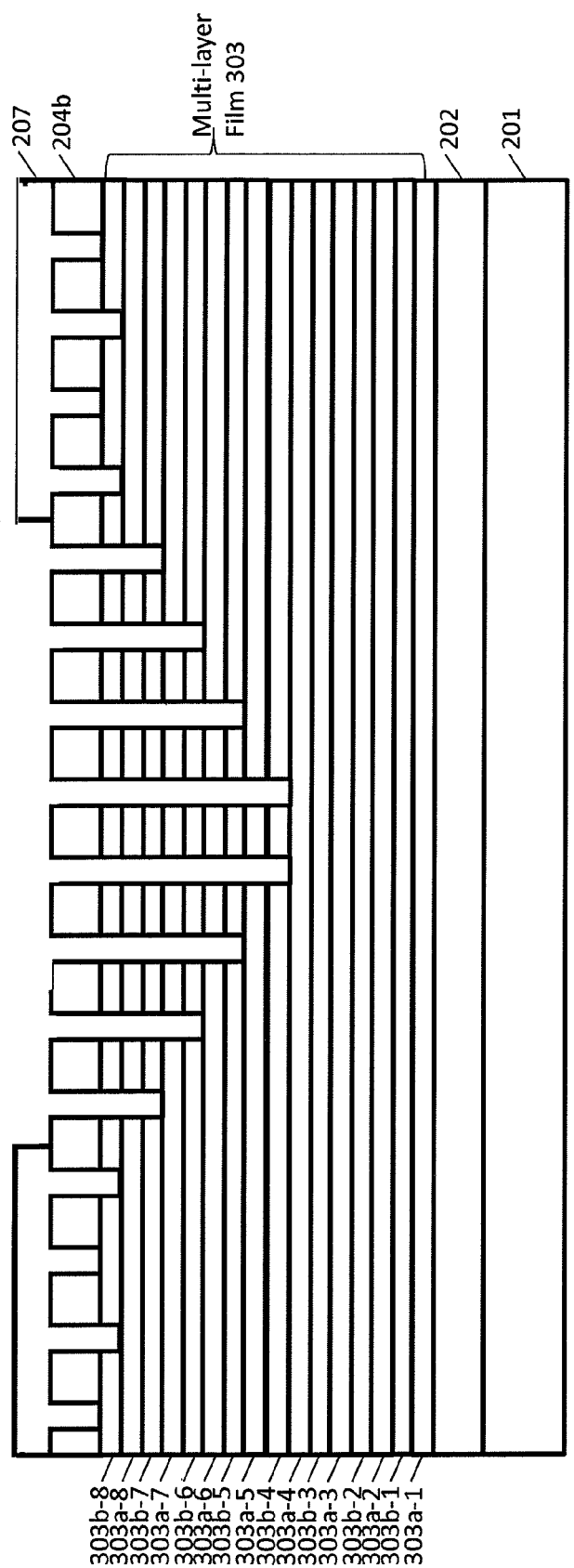
Figure 2P:
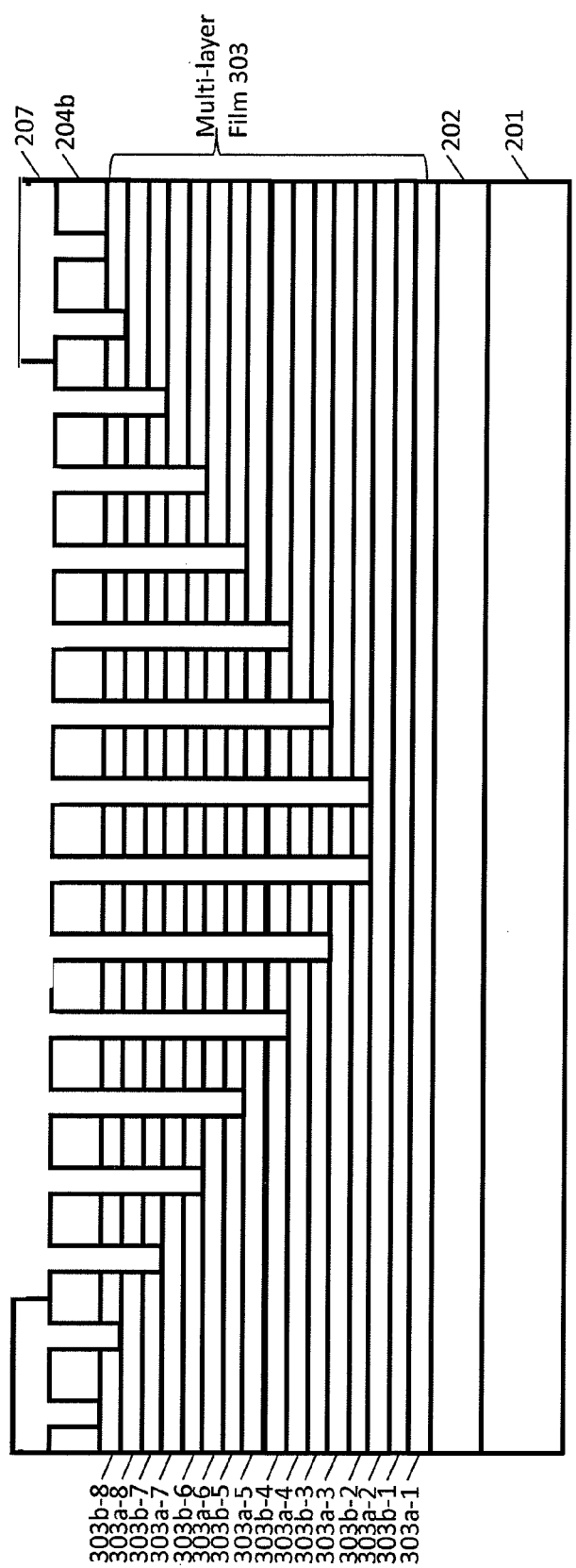

FIG. 2g shows a first polymer layer 207 and a second polymer 208 like that of the other example of the present invention are formed on the patterned dielectric layer 204b. Furthermore, a third photoresist layer 312 is formed on the second polymer layer 208 with a hole, so that when the first and second polymers 207 and 208 are etched based on the third photoresist layer 312, the four holes located at the center of the set of holes in the patterned dielectric layer 204b may be exposed as shown in FIG. 2h. The third patterned photoresist layer 312 and the second polymer layer 208 are etched away during the process. Subsequently, portions of the top conductive layer 303a-8 exposed by the two holes at the center of the set of holes are etched as shown in FIG. 2i, following which, portions of dielectric layers 303b-7 and 303b-8 that are exposed by the four holes are etched as shown in FIG. 2j. Referring to FIG. 2k, after the step shown in FIG. 2j, portions of the conductive layers 303a-7 and 303a-8 exposed by the four holes are etched. Subsequently, portions of the dielectric layers 303b-7 and 303b-6 exposed by the four holes are etched as shown in FIG. 2l.

FIG. 2m shows that the first polymer layer is etched to expose four more holes in the patterned dielectric layer 204b. Steps similar to those described with reference to FIGS. 2i to 2l are performed, followed by a step similar to that described with reference to FIG. 2m, so as to pattern the multi-layer film 303 as shown in FIGS. 2n to 2q.

The height of the first polymer layer 207 may gradually decrease during the etching of the multi-layer film 203 and 303. The first and second polymer layers 207 and 208 in one example according to the present invention may have a thickness between 2000 to 6000 angstrom (Å) and 500 to 1200 Å, respectively. In another example according to the present invention, the thickness of the first and second polymer layers 207 and 208 are 3000Å and 600Å, respectively. One skilled in the art may determine the appropriate thickness of the first and second polymers 207 and 208 based on the material of the polymer layers and the content of the plasma for etching the polymers.

The number of conductive layers and dielectric layers in the multi-layer film may be an even number, such as 2, 4, 8, 16 and 32. If, for example, a multi-layer film comprises N conductive layers and N dielectric layer stacked in an alternating manner, at least 2N holes can be etched in a set, where each of the N conductive layers is in contact with two of the 2N holes.

It will be appreciated by those skilled in the art that changes could be made to the examples described above without departing from the broad inventive concept thereof. For example, the etch masks 204a and 204b may have the pattern as shown in FIG. 3c. A tri-layer film as described above may be formed and patterned to have a first opening, which exposes holes 206a-4 and 206a-6 of the etch mask 204a/204b. Through the first opening, a portion of the dielectric layer at the top of the multi-layer film may be etched back, so as to form a contact hole under the exposed holes 206a-4 and 206a-6. Subsequently, another photoresist layer may be formed on the patterned tri-layer film, so that when the tri-layer film is etched, a second opening is formed in the first polymer layer to expose holes 403 and 404 of the etch mask 204a/204b. After which, the steps of etching the multi-layer film as described above for forming contact holes adjacent to existing contact holes may be performed.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A method for patterning a multi-layer film in a semiconductor device, the method comprising the steps of:
    providing a substrate;
    forming the multi-layer film on the substrate, wherein the multi-layer film comprises N conductive layers and N dielectric layers alternatingly stacked and the N-th dielectric layer is formed at the top of the multi-layer film, N being a positive integer;
    forming a patterned dielectric layer on the multi-layer film, wherein the patterned dielectric layer comprises at least one set of 2N holes;
    setting two variables $N_1$ and $N_2$, where $N_1$ and $N_2$ are initially set as N;
    forming a patterned first polymer layer on the patterned dielectric layer, wherein the patterned first polymer layer comprises at least one opening, each of the at least one opening exposes the $N_1$-th and the $(N_2+1)$-th holes of one of the at least one set of 2N holes of the patterned dielectric layer;
    etching the multi-layer film based on the patterned first polymer layer to expose a portion of the Nth conductive layer; and
    repeating the steps of:
        etching the patterned first polymer layer such that the $(N_1-1)$-th and the $(N_2+2)$-th holes of each of the at least one set of 2N holes of the patterned dielectric layer are exposed,
        etching the multi-layer film based on the exposed portions of the patterned dielectric layer by first etching back the exposed conductive
        layers, and then etching back the exposed dielectric layers,
        decreasing $N_1$ by 1, and
        increasing $N_2$ by 1,
    until $N_1-1$ is less than 0.

2. The method of claim 1, wherein step of forming a patterned dielectric layer on the multi-layer film further comprises the steps of:
    forming a dielectric layer on the multi-layer film;
    forming an anti-reflective layer on the dielectric layer;
    forming a patterned photoresist layer on the anti-reflective layer, wherein the patterned photoresist layer comprises at least one set of 2N holes; and
    etching the dielectric layer based on the patterned photoresist layer to form the patterned dielectric layer.

3. The method of claim 1 further comprises the steps of forming an insulator on the substrate before the step of forming the multi-layer film on the substrate.

4. The method of claim 3, wherein the insulator comprises silicon oxide or an oxide-nitride-oxide layer;
    the conductive layers of the multi-layer film comprise poly silicon;
    the dielectric layers of the multi-layer film comprise silicon oxide;
    the patterned dielectric layer comprises silicon nitride; and
    the patterned first polymer comprises high carbon density organic layer.

5. The method of claim 1, wherein the step of forming the patterned first polymer layer further comprises the steps of:
    forming a first polymer layer;
    forming a patterned photoresist layer on the first polymer layer, wherein the patterned photoresist layer comprises an opening over the $N_1$-th and the $(N_2+1)$-th holes of the patterned dielectric layer; and
    etching the first polymer layer based on the patterned photoresist layer to form the patterned first polymer layer.

6. The method of claim 5 further comprises the step of forming a second polymer layer on the first polymer layer before the step of forming the patterned photoresist layer on the first polymer.

7. The method of claim 6, wherein the second polymer comprises high silicon contained hard mask bottom anti-reflective coating (BARC) and has a thickness between 500 to 1200Å, the patterned photoresist layer has a thickness between 800 to 2000Å, and the patterned first polymer has a thickness between 2000 to 6000Å.

8. A method for patterning a multi-layer film in a semiconductor device comprising the steps of:
    providing a substrate;
    forming the multi-layer film on the substrate, wherein the multi-layer film comprises N conductive layers and N dielectric layers alternatingly stacked and the Nth dielectric layer is formed at the top of the multi-layer film, N being a positive integer;
    forming a patterned dielectric layer on the multi-layer film, wherein the patterned dielectric layer comprises at least one set of 2N holes;
    forming a first anti-reflective layer on the patterned dielectric layer;
    setting two variables $N_1$ and $N_2$, where $N_1$ and $N_2$ are initially set as N;
    forming a first patterned photoresist layer on the first anti-reflective layer, wherein the first patterned photoresist layer comprises a hole over each of the even-numbered holes of the 1st to $N_1$th holes of each of the at least one set of 2N holes of the patterned dielectric layer, and a hole over each of the odd-numbered holes of the $(N_2+1)$-th to 2Nth holes of each of the at least one set of 2N holes of the patterned N+lth dielectric layer;
    etching the first anti-reflective layer based on the firstsecond patterned photoresist layer;
    removing the first second patterned photoresist layer and the remaining first anti-reflective layer;
    forming a first polymer layer on the patterned dielectric layer;
    forming a second patterned photoresist layer on the first polymer layer, wherein the second patterned photoresist layer comprises a hole over the $(N_1-1)$-th, $N_1$th, $(N_2+1)$-th and $N_2+2$th holes of each of the at least one set of 2N holes of the patterned dielectric layer;
    etching through the first polymer layer based on the second patterned photoresist layer, such that the $(N_1-1)$-th, $N_1$th, $(N_2+1)$-th and $(N_2+2)$-th holes of each of the at least one set of 2N holes of the patterned dielectric layer are exposed;
    etching the multi-layer film based on the exposed patterned dielectric layer, such that the $N_1$th and $(N_2+1)$-th holes of each of the at least one set of 2N holes of the patterned dielectric layer expose a portion of the (N-2)-th conductive layer, and the ($N_1$-1)-th and ($N_2$+2)-th holes of each of the at least one set of 2N holes of the patterned dielectric layer expose a portion of the (N-1)-th conductive layer; and repeating the steps of:

etching the first polymer layer such that the ($N_1$-2)-th, ($N_1$-3)-th, ($N_2$+3)-th and ($N_2$+4)-th holes of each of the at least one set of 2N holes of the patterned dielectric layer are exposed;

etching the multi-layer film based on the exposed patterned dielectric layer by first etching away the exposed conductive layers, and subsequently etching away portions of two of the N dielectric layers and one of the N conductive layers exposed by each hole;

decreasing $N_1$ by 2; and increasing $N_2$ by 2, until $N_1$-2 is less than 0.

9. The method of claim 8, wherein step of forming a patterned dielectric layer on the multi-layer film further comprises the steps of:

forming a dielectric layer on the multi-layer film;

forming a second anti-reflective layer on the dielectric layer;

forming a third patterned photoresist layer on the second anti-reflective layer, wherein the third patterned photoresist layer comprises at least one set of 2N holes; and etching the dielectric layer based on the third patterned photoresist layer to form the patterned dielectric layer.

10. The method of claim 8 further comprises the steps of:

forming an insulator on the substrate before the step of forming the multi-layer film on the substrate; and forming a second polymer layer on the first polymer layer before the step of forming a fourth patterned photoresist layer on the second polymer layer.

11. The method of claim 10, wherein the insulator comprises silicon oxide or an oxide-nitride-oxide layer;

the conductive layers of the multi-layer film comprise poly silicon;

the dielectric layers of the multi-layer film comprise silicon oxide;

the patterned dielectric layer comprises silicon nitride;

the first polymer comprises one of high carbon density organic layer; and the second polymer comprises one of high silicon contained hard mask bottom anti- reflective coating (BARC).

12. The method of claim 10, wherein the first polymer has a thickness between 2000 to 6000Å;

the second polymer as a thickness between 500 to 1200Å; and the fourth patterned photoresist layer has a thickness between 800 to 2000Å.

13. A method for patterning a multi-layer film in a semiconductor device, the method comprising the steps of:

providing a substrate;

forming an insulator on the substrate;

forming the multi-layer film on the insulator, wherein the multi-layer film comprises a plurality of conductive layers and a plurality of dielectric layers alternatingly stacked;

forming a patterned dielectric layer on the multi-layer film, wherein the patterned dielectric layer comprises a plurality of holes;

forming a first polymer layer on the patterned dielectric layer, the first polymer having a thickness between 2000 to 6000Å;

forming a second polymer layer on the first polymer layer, the second polymer having a thickness between 500 to 1200Å;

forming a first patterned photoresist layer on the second polymer layer, wherein the first patterned photoresist layer has a thickness between 800 to 2000Å and comprises a first opening over at least one hole of the patterned dielectric layer;

etching the first polymer layer and the second polymer layer based on the first patterned photoresist layer to form a patterned first polymer layer, wherein the patterned first polymer layer comprise a second opening which exposes at least one first hole of the holes in the patterned dielectric layer;

etching the first polymer layer and the second polymer layer based on the first patterned photoresist layer to form a patterned first polymer layer, wherein the patterned first polymer layer comprise a second opening which exposes at least one first hole of the holes in the patterned dielectric layer;

etching the multi-layer film through the second opening to form at least one first contact hole under each of the exposed at least one first hole of the patterned dielectric layer;

forming a third opening in the patterned polymer layer to expose at least one second hole of the holes in the patterned dielectric layer; and etching the multi-layer film through the second opening and the third opening to form at least one second contact hole under each of the exposed at least one second hole in the patterned dielectric layer, and to etch each of the at least one first contact hole deeper, wherein the at least one first contact hole is deeper than the at least one second contact hole, the first contact hole under each of the exposed at least one first hole of the patterned dielectric layer, and the second contact hole under each of the exposed at least one second hole in the patterned dielectric layer are used to form contact plugs, and each of the contact plugs is precisely aligned with a contact hole in the multi-layer film.

14. The method of claim 13, wherein step of forming a patterned dielectric layer on the multi-layer film further comprises the steps of:

forming a dielectric layer on the multi-layer film;

forming an anti-reflective layer on the dielectric layer; and forming a second patterned photoresist layer on the anti-reflective layer, wherein the second patterned photoresist layer comprises a plurality of holes; and etching the dielectric layer based on the second patterned photoresist layer to form the patterned dielectric layer.

15. The method of claim 13, wherein the insulator comprises silicon oxide or an oxide-nitride-oxide layer;

the conductive layers of the multi-layer film comprise poly silicon;

the dielectric layers of the multi-layer film comprise silicon oxide;

the patterned dielectric layer comprises silicon nitride;

the first polymer comprises high carbon density organic layer; and the second polymer comprises high silicon contained hard mask bottom anti-reflective coating (BARC).

* * * * *